US012646568B2

(12) United States Patent
Lee et al.

(10) Patent No.: US 12,646,568 B2
(45) Date of Patent: Jun. 2, 2026

(54) STORAGE DEVICE FOR SELECTIVELY PERFORMING HIGH-RELIABILITY PROGRAM OPERATION ACCORDING TO TEMPERATURE, AND OPERATION METHOD OF THE STORAGE DEVICE

(71) Applicant: Samsung Electronics Co., Ltd., Suwon-si (KR)

(72) Inventors: Sewoong Lee, Suwon-si (KR); Kwangjin Lee, Suwon-si (KR); Kirock Kwon, Suwon-si (KR); Kyungduk Lee, Suwon-si (KR); Sangsoo Cha, Suwon-si (KR); Younsoo Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 18/666,874

(22) Filed: May 17, 2024

(65) Prior Publication Data

US 2025/0118371 A1 Apr. 10, 2025

(30) Foreign Application Priority Data

Oct. 4, 2023 (KR) ........................ 10-2023-0131936

(51) Int. Cl.
*G11C 16/10* (2006.01)
*G11C 7/04* (2006.01)
(Continued)

(52) U.S. Cl.
CPC .............. *G11C 16/102* (2013.01); *G11C 7/04* (2013.01); *G11C 16/32* (2013.01); *G11C 16/3459* (2013.01)

(58) Field of Classification Search
CPC ... G11C 16/102; G11C 16/32; G11C 16/3459; G11C 7/04
(Continued)

(56) References Cited

U.S. PATENT DOCUMENTS 7,953,574 B2 5/2011 Arakawa et al.
9,852,067 B2 12/2017 Kim
(Continued)

FOREIGN PATENT DOCUMENTS

JP 3870189 B2 1/2007
KR 20210013845 A 2/2021

OTHER PUBLICATIONS

Extended European Search Report corresponding to European Application No. 24203952.7 (10 pages) (Mar. 12, 2025),.

*Primary Examiner* — Sung Il Cho
(74) *Attorney, Agent, or Firm* — Wolf, Greenfield & Sacks, P.C.

(57) ABSTRACT

Provided is a storage device including a memory device including a plurality of memory blocks each including a plurality of memory cells, a controller configured to control a program operation of the memory device in response to a write request received from a host, and a temperature sensor configured to measure an internal temperature, wherein the controller is further configured to, based on a first temperature measured by the temperature sensor, activate one of the plurality of memory blocks as a risk block and then control a high-reliability program operation using the risk block, or activate one of the plurality of memory blocks as a first normal block and then control a normal program operation using the first normal block.

19 Claims, 31 Drawing Sheets

(51) Int. Cl.
    *G11C 16/32*      (2006.01)
    *G11C 16/34*      (2006.01)

(58) Field of Classification Search
    USPC ................................................... 365/189.011
    See application file for complete search history.

(56)                References Cited

U.S. PATENT DOCUMENTS

| | | | |
|---|---|---|---|
| 10,553,301 B2 | 2/2020 | K et al. | |
| 11,029,888 B2 | 6/2021 | Kim | |
| 11,119,693 B2 | 9/2021 | Ahn et al. | |
| 11,216,336 B2 | 1/2022 | Mizushima et al. | |
| 11,481,126 B2 | 10/2022 | Ivanov | |
| 2013/0159607 A1* | 6/2013 | Kyung ................... | G11C 5/147 |
| | | | 711/E12.008 |
| 2016/0104539 A1 | 4/2016 | Kim et al. | |
| 2020/0310687 A1* | 10/2020 | Huang ................. | G06F 3/0634 |
| 2020/0348887 A1* | 11/2020 | Kim ...................... | G06F 3/0659 |
| 2021/0132817 A1* | 5/2021 | Bhat ..................... | G06F 3/0658 |
| 2022/0189558 A1* | 6/2022 | Wu .................... | G11C 16/0483 |
| 2022/0206920 A1* | 6/2022 | Bhat ..................... | G06F 3/0653 |
| 2022/0375510 A1 | 11/2022 | Wu | |
| 2022/0392516 A1 | 12/2022 | Cha et al. | |
| 2023/0168813 A1 | 6/2023 | Bueb | |
| 2023/0367377 A1* | 11/2023 | Vaysman ................. | G06F 1/26 |
| 2023/0367378 A1* | 11/2023 | Vaysman ............. | G06F 1/3221 |

* cited by examiner

Figure 1:
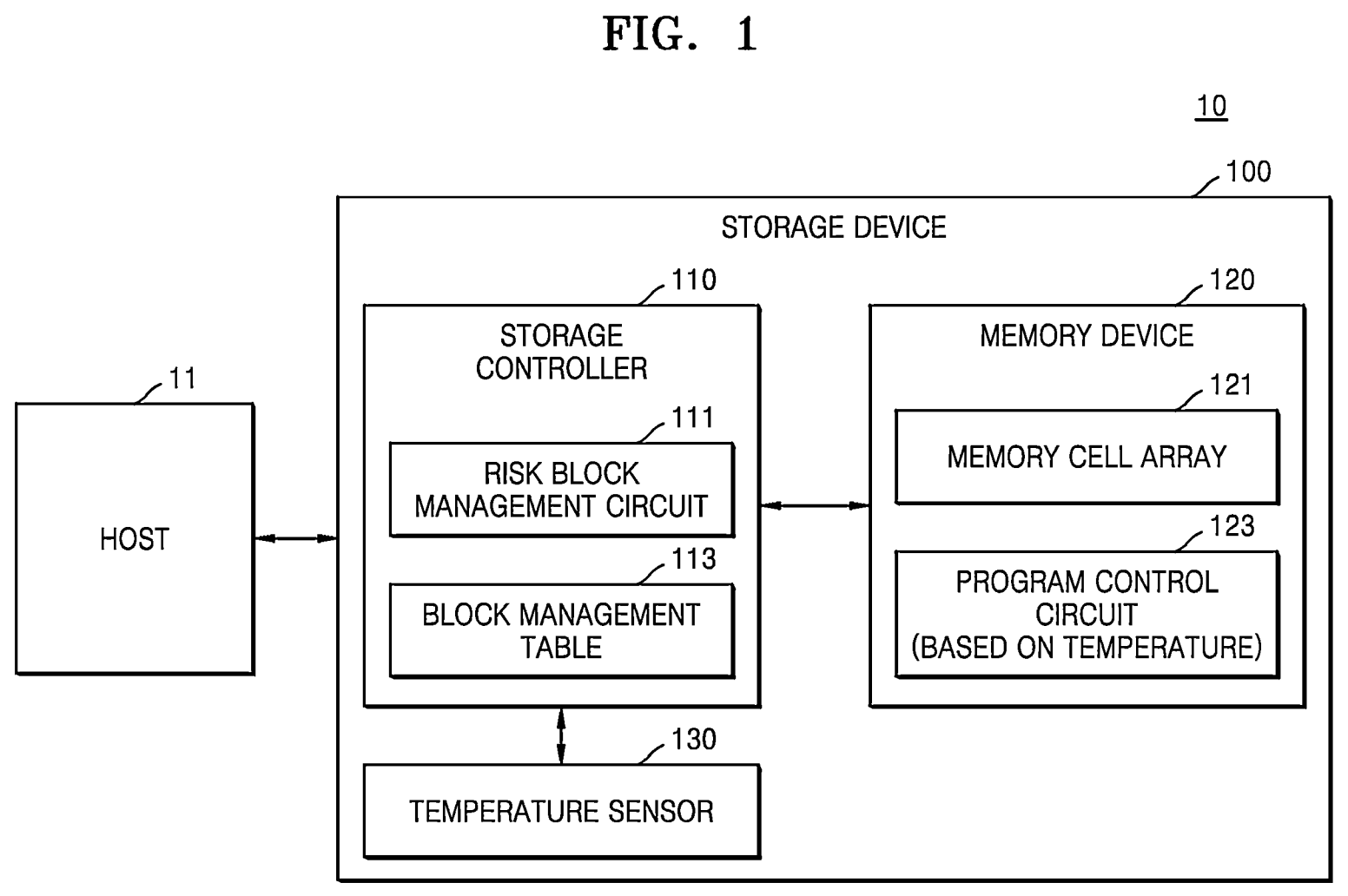

STORAGE DEVICE — 100

MEMORY DEVICE — 120

MEMORY CELL ARRAY — 121

PROGRAM CONTROL CIRCUIT (BASED ON TEMPERATURE) — 123

STORAGE CONTROLLER — 110

RISK BLOCK MANAGEMENT CIRCUIT — 111

BLOCK MANAGEMENT TABLE — 113

TEMPERATURE SENSOR — 130

HOST — 11

PRIOR ART

120

124
VOLTAGE GENERATOR

125
ROW DECODER

SSL
WL
GSL

121
MEMORY CELL ARRAY

BLK1

BLK2

BLKi

ADDR

122
CONTROL LOGIC

123
PROGRAM CONTROL CIRCUIT (BASED ON TEMPERATURE)

ADDC

BL

PAGE BUFFER UNIT — 126

COLUMN DECODER — 127

DL

128
I/O CIRCUIT

CMD

ADD

DATA

PRIOR ART

PRIOR ART

PRIOR ART

| BLOCK NUMBER | TYPE INDICATION |
|---|---|
| #1 | TYPE_1 |
| #2 | TYPE_2 |
| #3 | TYPE_2 |

| BLOCK NUMBER | TYPE INDICATION |
|:---:|:---:|
| #1 | TYPE_1 |
| #2 | TYPE_2 |
| #3 | TYPE_3 |

MEASURE CURRENT TEMPERATURE TO
IDENTIFY TREND OF CHANGES IN TEMPERATURES ⸺ S411B

ADJUST THRESHOLD NUMBER
BASED ON IDENTIFIED TREND ⸺ S412B

FIG. 15A

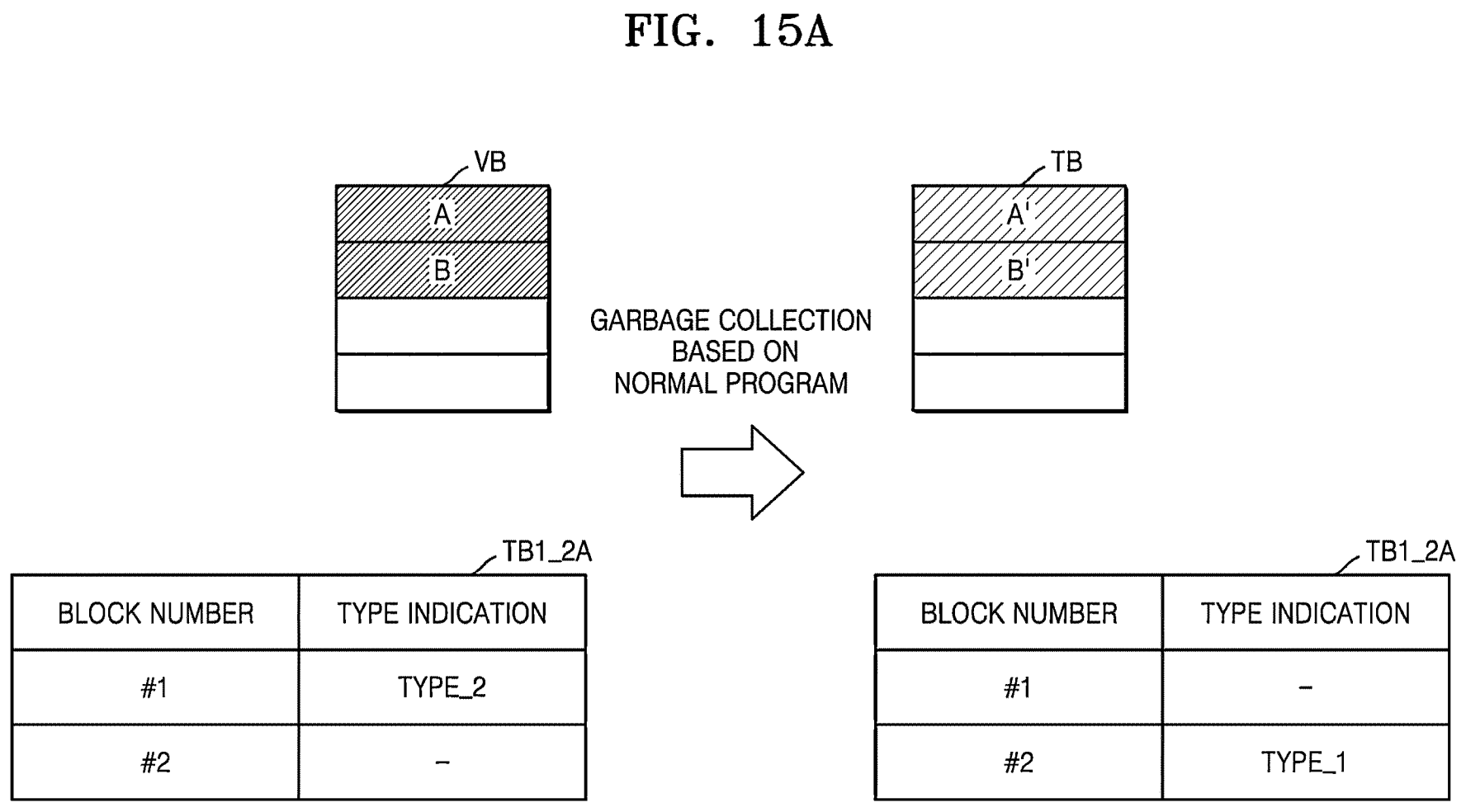

GARBAGE COLLECTION
BASED ON
NORMAL PROGRAM

TB1_2A

| BLOCK NUMBER | TYPE INDICATION |
|---|---|
| #1 | – |
| #2 | TYPE_1 |

TB1_2A

| BLOCK NUMBER | TYPE INDICATION |
|---|---|
| #1 | TYPE_2 |
| #2 | – |

FIG. 15B

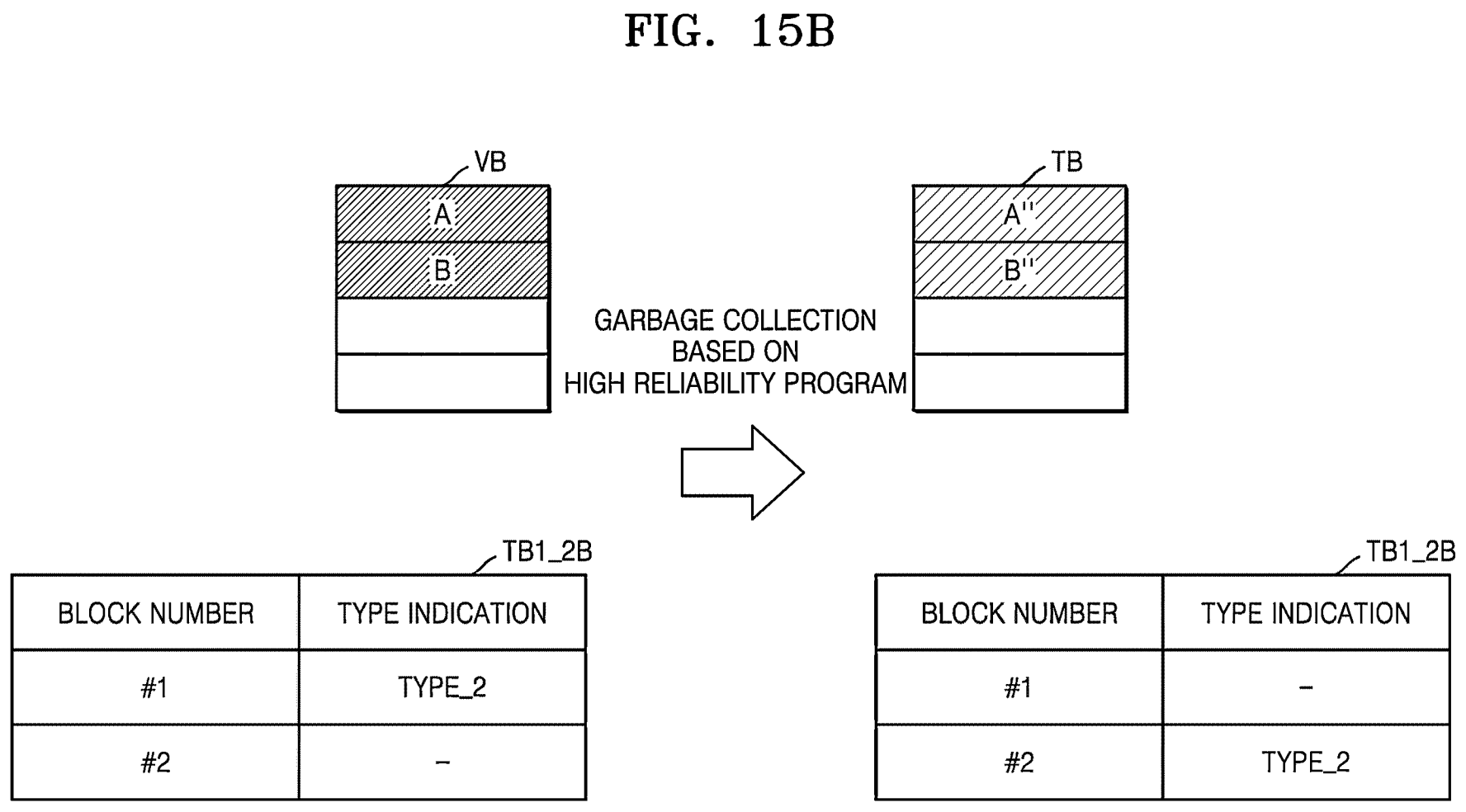

GARBAGE COLLECTION
BASED ON
HIGH RELIABILITY PROGRAM

VB

A'
B'

TB

A"
B"

TB1_2B

| BLOCK NUMBER | TYPE INDICATION |
|---|---|
| #1 | TYPE_2 |
| #2 | – |

TB1_2B

| BLOCK NUMBER | TYPE INDICATION |
|---|---|
| #1 | – |
| #2 | TYPE_2 |

FIG. 18A

BLK1 | BLK2 | ··· | BLKi

NORMAL PROGRAM →

TB1

| BLOCK NUMBER | TYPE INDICATION |
|---|---|
| #1 | TYPE_1 |
| #2 | TYPE_1 |
| #3 | TYPE_2 |

TB2

| BLOCK NUMBER | DATA REFRESH INDICATION |
|---|---|
| #1 | V1 |
| #2 | V2 |
| #3 | V2 |

FIG. 18B

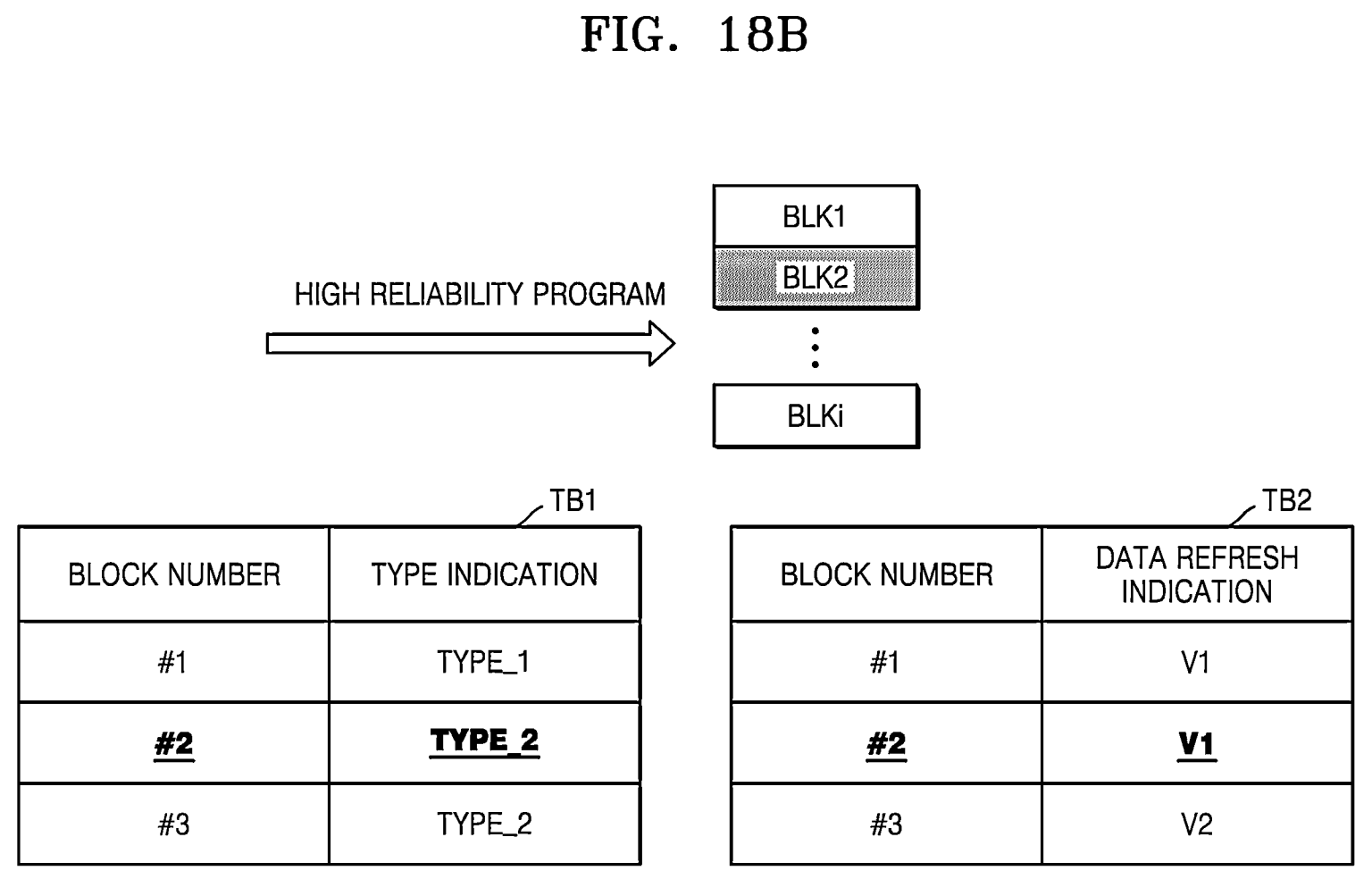

BLK1   BLK2   · · ·   BLKi

HIGH RELIABILITY PROGRAM

TB1

| BLOCK NUMBER | TYPE INDICATION |
|---|---|
| #1 | TYPE_1 |
| #2 | TYPE_2 |
| #3 | TYPE_2 |

TB2

| BLOCK NUMBER | DATA REFRESH INDICATION |
|---|---|
| #1 | V1 |
| #2 | V1 |
| #3 | V2 |

FIG. 19

```
ADJUST THRESHOLD BASED ON
MEASURED TEMPERATURE          — S551
```

PRIOR ART

PRIOR ART

STORAGE DEVICE FOR SELECTIVELY PERFORMING HIGH-RELIABILITY PROGRAM OPERATION ACCORDING TO TEMPERATURE, AND OPERATION METHOD OF THE STORAGE DEVICE

CROSS-REFERENCE TO RELATED APPLICATION

This application is based on and claims priority under 35 U.S.C. § 119 to Korean Patent Application No. 10-2023-0131936, filed on Oct. 4, 2023, in the Korean Intellectual Property Office, the disclosure of which is incorporated by reference herein in its entirety.

BACKGROUND

The inventive concept relates to a storage device for performing a memory operation according to a request from a host, and an operation method of the storage device.

A storage system includes a host (or a host device) and a storage device, and the host and the storage device are connected to each other through various interface standards such as a Universal Flash Storage (UFS), Serial Advanced Technology Attachment (SATA), Small Computer System Interface (SCSI), Serial Attached SCSI (SAS), or embedded MultiMediaCard (MMC) (eMMC). The storage device includes a memory device configured as non-volatile memory, and a controller, and the non-volatile memory may include flash memory, magnetoresistive random-access memory (MRAM), phase-change RAM (PRAM), ferroelectric RAM (FeRAM), and the like.

In order to satisfy criteria according to a reliability evaluation procedure for electronic components supplied to automobiles, stable performance needs to be guaranteed over a wide range of temperature. However, due to limitations in the physical characteristics of non-volatile memory cells (e.g., NAND flash memory cells) of a storage device included in the electronic component, as the difference between the temperature when a program operation on particular data is performed, and the temperature when a read operation on the data is performed changes, the error probability for the data increases, which may lead to a decrease in the performance of the storage device.

Accordingly, research is being actively conducted on storage devices capable of performing a memory operation with guaranteed reliability even over a wide range of temperature.

SUMMARY

The inventive concept provides an electronic device capable of providing improved reliability by selectively performing a high-reliability program operation and a normal program operation based on the internal temperature of a storage device, and an operation method of the electronic device.

According to some embodiments of the inventive concept, there is provided a storage device including a memory device including a plurality of memory blocks each including a plurality of memory cells, a controller configured to control a program operation of the memory device in response to a write request received from a host, and a temperature sensor configured to measure an internal temperature, wherein the controller is further configured to, based on a first temperature measured by the temperature sensor, activate one of the plurality of memory blocks as a risk block and then control a high-reliability program operation using the risk block, or activate one of the plurality of memory blocks as a first normal block and then control a normal program operation using the first normal block.

According to some embodiments of the inventive concept, there is provided a storage device including a memory device including a first memory block operated as a single-level cell, and second memory blocks operated as a multi-level cell, a controller configured to control a program operation of the memory device in response to a write request received from a host, and a temperature sensor configured to measure an internal temperature, wherein the program operation of the memory device in response to a write request comprises programming data corresponding to the write request into the first memory block, and based on a first temperature measured by the temperature sensor within a preset time period, activating one of the second memory blocks as a risk block and then controlling a high-reliability data migration operation on the data by using the risk block, or activating one of the second memory blocks as a normal block and then controlling a normal data migration operation on the data by using the normal block.

According to some embodiments of the inventive concept, there is provided a storage device including a memory device including a plurality of memory blocks each including a plurality of memory cells, a controller configured to control a program operation of the memory device in response to at least one write request received from a host, and a temperature sensor configured to measure an internal temperature, wherein the controller is further configured to, based on at least one of a first temperature measured by the temperature sensor or whether an environment is limited in a time period for programming, activate one of the plurality of memory blocks as a risk block and then control a high-reliability program operation using the risk block, or activate one of the plurality of memory blocks as a normal block and then control a normal program operation using the normal block.

According to another aspect of the inventive concept, there is provided an operation method of a storage device, the operation method including measuring a current internal temperature in response to a write request received from a host, determining whether the current internal temperature that was measured is within a normal range, dynamically activating one of a risk block or a normal block based on a result of the determining, and based on a result of the activating, selectively performing one of a high-reliability program operation using the risk block, or a normal program operation using the normal block.

BRIEF DESCRIPTION OF THE DRAWINGS

Embodiments will be more clearly understood from the following detailed description taken in conjunction with the accompanying drawings in which:

FIG. 1 is a block diagram schematically illustrating a storage system according to some embodiments;

FIG. 7 is a diagram for describing in detail a program operation according to some embodiments;

FIGS. 9B and 9C are diagrams for describing block management tables according to some embodiments;

FIGS. 15A and 15B are diagrams for describing a garbage collection operation of a storage device according to some embodiments;

FIGS. 18A and 18B are flowcharts for describing an operation of managing a data refresh table of a storage device, according to some embodiments;

FIG. 19 is a flowchart for describing in detail an operation method of a storage device in operation S550 of FIG. 17;

DETAILED DESCRIPTION

Figure 2:
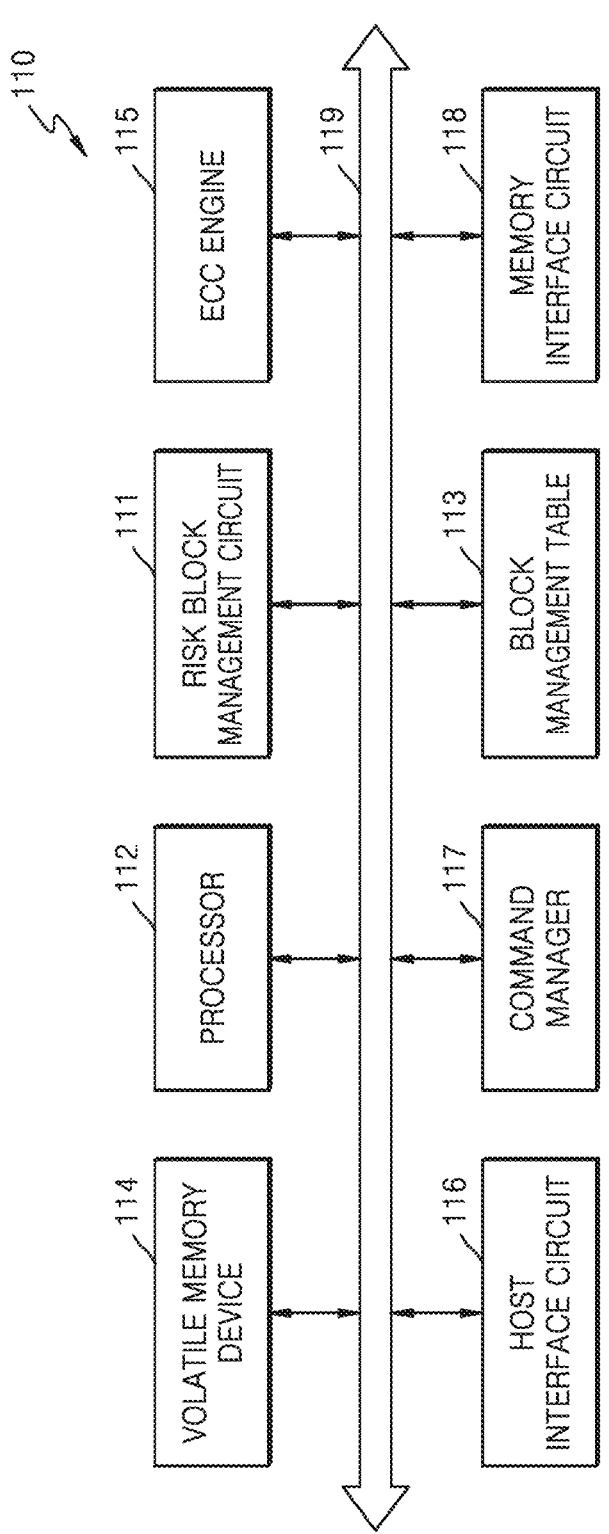
FIG. 2 is a detailed block diagram of a controller of FIG. 1 according to some embodiments.

FIG. 1 is a block diagram schematically illustrating a storage system 10 according to some embodiments. The storage system 10 may be a computing system configured to process various pieces of information, such as a personal computer (PC), a notebook, a laptop, a server, a workstation, a tablet PC, a smart phone, a digital camera, or a dashboard camera. In the present specification, examples will be described in which the storage system 10 is implemented as a vehicle computing system for performing a highly reliable operation over a wide range of temperature, but the inventive concept may also be applied to computing systems in other industries.

Referring to FIG. 1, the storage system 10 may include a host 11 and a storage device 100.

The host 11 may control the overall operation of the storage system 10. For example, the host 11 may store data in the storage device 100, or read data stored in the storage device 100.

The storage device 100 may include a controller 110, a memory device 120, and a temperature sensor 130. The controller 110 may control a first memory operation of the memory device 120 in response to a request from the host 11. For example, the controller 110 may program data received from the host 11, into the memory device 120 in response to a write request from the host 11, or provide data read from the memory device 120 to the host 11 in response to a read request from the host 11. In addition, the controller 110 may control a second memory operation on the memory device 120 in order to increase the reliability of data stored in the memory device 120 or to increase the utilization of the storage space of the memory device 120. For example, the controller 110 may control a garbage collection operation or a data migration operation on the memory device 120.

The inventive concept relates to embodiments of the storage device 100 for performing programming by using a program scheme that matches a high temperature range or a low temperature range for maintaining the reliability of data stored in the memory device 120 for as long as possible at a temperature within an abnormal range rather than a normal range, and then, performing a garbage collection operation or a data migration operation for preventing reliability degradation due to deterioration of the data stored in the memory device 120 at the temperature within the abnormal range. Hereinafter, detailed embodiments of the storage device 100 will be described, but it will be fully understood that the components of the storage device 100 illustrated in FIG. 1 or other drawings are only examples, and the inventive concept is not limited thereto. In the present specification, the normal range may be referred to as a normal temperature range, and the abnormal range may be referred to as an abnormal temperature range.

In some embodiments, the controller 110 may include a risk block management circuit 111 and a block management table 113. In addition, in some embodiments, the memory device 120 may include a memory cell array 121 and a program control circuit 123. In some embodiments, the memory device 120 may be NAND flash memory, vertical NAND (VNAND), NOR flash memory, and resistive random-access memory (RRAM), phase-change memory (PRAM), magnetoresistive random-access memory (MRAM), ferroelectric random-access memory (FRAM), spin-transfer torque random-access memory (STT-RAM), or the like. In addition, the memory device 120 may be implemented in a three-dimensional array structure. Furthermore, the memory device 120 may be a flash in which a charge storage layer includes a conductive floating gate, or a charge trap flash (CTF) in which a charge storage layer includes an insulating layer. Hereinafter, some embodiments in which the memory device 120 is a NAND flash memory will be mainly described, but the inventive concept is not limited thereto.

In some embodiments, the risk block management circuit 111 may receive a current temperature of the storage device 100, measured by the temperature sensor 130, in order to perform an operation according to a write request received from the host 11.

In some embodiments, when the current temperature is within the abnormal range, the risk block management circuit 111 may activate any one of a plurality of memory blocks included in the memory cell array 121 as a risk block. The risk block management circuit 111 may control a high-reliability program operation using the activated risk block. In the present specification, the risk block is defined as a memory block on which programming is performed in the abnormal range, and may also be referred to as a risk temperature buffer or a risk temperature block. In addition, in the present specification, activating, by the risk block management circuit 111, an arbitrary memory block as a risk block may include selecting a memory block on which the high-reliability program operation is to be performed, from among the plurality of memory blocks, and storing information indicating that the high-reliability program operation has been performed on the selected memory block, in the block management table 113.

In some embodiments, the risk block management circuit 111 may control a high-reliability program operation for storing data received along with the write request from the host 11, in the activated risk block. For example, the risk block management circuit 111 may provide the memory device 120 with a first program command for controlling the high-reliability program operation, the address of the activated risk block, and the data. In response to the first program command, the program control circuit 123 may program the data into the risk block indicated by the received address among the memory blocks of the memory cell array 121. In some embodiments, the first program command is a command that is pre-agreed between the controller 110 and the memory device 120 for indicating that the current temperature is within the abnormal range and thus the high-reliability program operation needs to be performed, and may be different from a second program command for a normal program operation. However, in some embodiments, the risk block management circuit 111 may additionally provide the program control circuit 123 with temperature information indicating the current temperature along with a program command common to the high-reliability program operation and the normal program operation, and select and perform any one of the high-reliability program operation and the normal program operation based on the temperature information.

In some embodiments, the abnormal range may include a high temperature range and a low temperature range, and the high-reliability program operation may include a first high-reliability program operation corresponding to the high temperature range and a second high-reliability program operation corresponding to the low temperature range. The first high-reliability program operation may be based on a first program scheme considering a first deterioration characteristic of the memory cells of the memory cell array 121 in the high temperature range, and the second high-reliability program operation may be based on a second program scheme considering a second deterioration characteristic of the memory cells of the memory cell array 121 in the low temperature range.

In detail, the first deterioration characteristic may correspond to a characteristic in which the retention period of charges in memory cells programmed in the high temperature range deteriorates rapidly according to changes in temperature, and the second deterioration characteristic may correspond to a characteristic in which threshold voltage distributions of memory cells in an erased state among program memory cells become broad in the low temperature range.

In some embodiments, the first program scheme may be for causing first threshold voltage distributions of memory cells into which data is programmed to be sharper than second threshold voltage distributions formed by the normal program operation, and may be a scheme for preventing read disturb or disturbance when reading from the memory cells due to the first deterioration characteristic. In addition, the second program scheme is for causing a first gap between a threshold voltage distribution in the erased state and a threshold voltage distribution in a first program state, among the first threshold voltage distributions of the memory cells into which data is programmed, to be greater than a second gap between a threshold voltage distribution in the erased state and a threshold voltage distribution in the first program state, among the second threshold voltage distributions formed by the normal program operation, and may be a scheme for preventing read disturb due to the second deterioration characteristic. Detailed embodiments of the above will be described below.

In some embodiments, in order for the program control circuit 123 to perform the first high-reliability program operation based on the first program scheme or the second high-reliability program operation based on the second program scheme, values of a plurality of program parameters corresponding to the number of program loops, voltage levels of program or verify voltages, and the like for the first high-reliability program operation or the second high-reliability program operation may be preset in the program control circuit 123.

As another example, when the current temperature is within the normal range, the risk block management circuit 111 may activate any one of the plurality of memory blocks included in the memory cell array 121 as a normal block. The risk block management circuit 111 may control a normal program operation using the activated normal block. In the present specification, activating, by the risk block management circuit 111, an arbitrary memory block as a normal block may include selecting a memory block on which the normal program operation is to be performed, from among the plurality of memory blocks, and storing information indicating that the normal program operation has been performed on the selected memory block, in the block management table 113.

In some embodiments, the risk block management circuit 111 may collect at least one of a trend of changes in temperatures measured by the temperature sensor 130, cell characteristics of the memory cells of the memory cell array 121, and a program/erase (P/E) cycle, and adjust the normal range and the abnormal range of temperature, based on the collection result. As a specific example, the risk block management circuit 111 may expand or reduce a particular range based on the collection result, and furthermore, deactivate a function corresponding to the range.

In some embodiments, the storage device 100 may include more memory devices, and the risk block management circuit 111 may set the normal range and the abnormal range differently for each memory device based on at least one of the memory cell characteristics and the P/E cycle.

In some embodiments, the block management table 113 may include information indicating memory blocks corresponding to a risk block type and memory blocks corresponding to a normal block type among the plurality of memory blocks of the memory cell array 121. In the present specification, a memory block activated as a risk block may be defined as having the risk block type, and a memory block activated as a normal block may be defined as having a normal block type. The block management table 113 may be managed by the risk block management circuit 111. In some embodiments, the block management table 113 may be stored in a buffer memory of the controller 110, and the block management table 113 may be backed up in the memory device 120.

In some embodiments, the risk block management circuit 111 may identify a risk block from among the plurality of memory blocks of the memory cell array 121 by referring to the block management table 113 and control a garbage collection operation for the identified risk block. The risk block is a memory block programmed at a temperature within the high temperature range or the low temperature range, and may require intensive management after programming in order to improve reliability. Accordingly, the risk block management circuit 111 may control a garbage collection operation specialized for the risk block instead of a garbage collection operation considering the number of invalid pages of existing memory blocks. The specialized garbage collection operation may be referred to as a reclaim garbage collection operation.

In some embodiments, when the number of error bits of the risk block identified through the block management table 113 is greater than a threshold number, the risk block management circuit 111 may control the garbage collection operation on the risk block. In some embodiments, the risk block management circuit 111 may not immediately control the garbage collection operation on the risk block even when the number of error bits of the identified risk block is greater than the threshold number, but may control the garbage collection operation only when a predetermined condition is satisfied. For example, the predetermined condition may include at least one of a condition that the current temperature measured by the temperature sensor 130 to perform the garbage collection operation be within the normal range, and/or a condition in which the garbage collection operation is urgently required. Detailed embodiments of the above will be described below.

In some embodiments in which the plurality of memory blocks of the memory cell array 121 of the memory device 120 are operated as different level cells, the inventive concept may be applied as follows. In the following embodiments, the description is made on the premise that the plurality of memory blocks of the memory cell array 121 include a first memory block operated by the controller 110 as a single-level cell such that data containing one bit is stored in one memory cell, and second memory blocks operated as multi-level cells such that data containing two bits is stored in one memory cell, but this is a non-limiting example, and the inventive concept is not limited thereto. Furthermore, the second memory blocks may be operated as triple-level cells, quadruple-level cells, or the like, but in the following embodiments, an example in which they are operated as multi-level cells will be mainly described.

In some embodiments, in response to a write request received from the host 11, the risk block management circuit 111 may perform control such that data received along with the write request is preferentially programmed into the first memory block of the memory cell array 121. That is, the risk block management circuit 111 may use the first memory block as a buffer to preferentially store the data in the first memory block regardless of the current temperature. In some embodiments, when the first memory block is unavailable due to its capacity limitation, as described above, the risk block management circuit 111 may activate any one of the second memory blocks as a risk block or a normal block based on the current temperature and control the program operation corresponding to the activated block.

In some embodiments, the risk block management circuit 111 may control an operation of migrating data temporarily stored in the first memory block to any one of the second memory blocks of the memory cell array 121 within a preset time period. As a specific example, the risk block management circuit 111 may receive the current temperature of the storage device 100 from the temperature sensor 130, for a data migration operation. When the current temperature is within the abnormal range, the risk block management circuit 111 may activate any one of the second memory blocks as a risk block, and then control a high-reliability data migration operation by using the risk block. In addition, when the current temperature is within the normal range, the risk block management circuit 111 may activate any one of the second memory blocks as a normal block, and then control a normal data migration operation by using the normal block.

In some embodiments, the high-reliability data migration operation may include the high-reliability program operation described above, and the normal data migration operation may include the normal program operation described above.

In some embodiments, each of the risk block management circuit 111 and the program control circuit 123 may be implemented as a software component, a hardware component, or a component in which software and hardware are combined. In addition, an operation of the risk block management circuit 111 may be understood as an operation of the controller 110, and an operation of the program control circuit 123 may be understood as an operation of the memory device 120.

When a temperature at a time point of performing a program operation is within the abnormal range, the storage device 100 according to some embodiments may dynamically activate a risk block and adaptively perform the high-reliability program operation or data migration operation using the activated risk block, thereby securing maximum reliability of data programmed in the abnormal range. In addition, the storage device 100 may improve the reliability of the data programmed in the abnormal range by performing the garbage collection operation specialized for the risk block. Accordingly, the storage device 100 may improve the overall performance of the storage system 10 by ensuring an excellent level of data reliability even under temperature conditions outside the normal range.

FIG. 2 is a detailed block diagram of the controller 110 of FIG. 1 according to some embodiments.

Referring to FIG. 2, the controller 110 may include the risk block management circuit 111, a processor 112, the block management table 113, a volatile memory device 114, an error correction code (ECC) engine 115, a host interface circuit 116, a command manager 117, a memory interface circuit 118, and a bus 119. In some embodiments, the controller 110 may be referred to as a storage controller or a memory controller. Each of the risk block management circuit 111, the ECC engine 115, and the command manager 117 may be implemented as a software component, a hardware component, or a component in which software and hardware are combined. In some embodiments, in a case in which at least one of the risk block management circuit 111, the ECC engine 115, and the command manager 117 is implemented as a software component, the software component may be loaded into the volatile memory device 114 and then executed by the processor 112. In addition, the block management table 113 may be stored in the volatile memory device 114 and managed by the risk block management circuit 111.

In some embodiments, the processor 112 may control the overall operation of the controller 110. The processor 112 may include a flash translation layer (FTL) component and may perform logical mapping, existing garbage collection, wear leveling, bad block management, error handling, flash recovery (data recovery), and the like through the FTL component.

In some embodiments, in order to control a program operation performed in response to a write request from the host 11 (see FIG. 1), the risk block management circuit 111 may dynamically activate any one of the plurality of memory blocks of the memory cell array 121 (see FIG. 1) as a risk block, based on the temperature of the storage device 100 (see FIG. 1). The risk block management circuit 111 may store information indicating the memory block activated as the risk block, in the block management table 113. The risk block management circuit 111 may control a high-reliability program operation on the risk block.

In some embodiments, the risk block management circuit 111 may control a garbage collection operation on the risk block by referring to the block management table 113. The risk block management circuit 111 may read data stored in the risk block and correct an error in the read data through the ECC engine 115. The risk block management circuit 111 may count the number of error bits between the corrected data and the read data, and when the number of error bits is greater than a threshold number, initiate the garbage collection operation on the risk block.

In some embodiments, in order to control a data migration operation, the risk block management circuit 111 may dynamically activate any one of the plurality of memory blocks of the memory cell array 121 (see FIG. 1) as a risk block, based on the temperature of the storage device 100 (see FIG. 1). The risk block management circuit 111 may store information indicating the memory block activated as the risk block, in the block management table 113. The risk block management circuit 111 may control a high-reliability data migration operation on the risk block.

In some embodiments, because the high-reliability program operation using the risk block requires a longer programming time period than a normal program operation using a normal block, the risk block management circuit 111 may control the normal program operation when a particular condition is satisfied even though the current temperature is within the abnormal range. For example, the particular condition refers to an environment in which a time period for programming is limited, and may be determined based on whether the amount of data requested by the host 11 be input/output per unit time is greater than or equal to a threshold.

The command manager 117 may generate commands indicating various operations to be performed by the memory device 120 (see FIG. 1). In some embodiments, the command manager 117 may generate a first program command for controlling a high-reliability program operation, and a second program command for controlling a normal program operation. The pattern of the first program command and the pattern of the second program command may be different from each other. In addition, the first program command may include different patterns when controlling the first high-reliability program operation corresponding to the high temperature range and when controlling the second high-reliability program operation corresponding to the low temperature range.

The controller 110 may communicate with the host 11 (see FIG. 1) through the host interface circuit 116. In some embodiments, the host interface circuit 116 may be implemented based on at least one of various interfaces such as Serial Advanced Technology Attachment (SATA), Peripheral Component Interconnect Express (PCIe), Serial Attached SCSI (SAS), Non-Volatile Memory Express (NVMe), or Universal Flash Storage (UFS).

The controller 110 may communicate with the memory device 120 (see FIG. 1) through the memory interface circuit 118. In some embodiments, the memory interface circuit 118 may be implemented based on a NAND interface.

The implementation example of the controller 110 illustrated in FIG. 2 is a non-limiting example, and the inventive concept is not limited thereto, and the controller 110 may be implemented in various manners to effectively control operations to ensure reliability according to the present disclosure.

Figure 3:
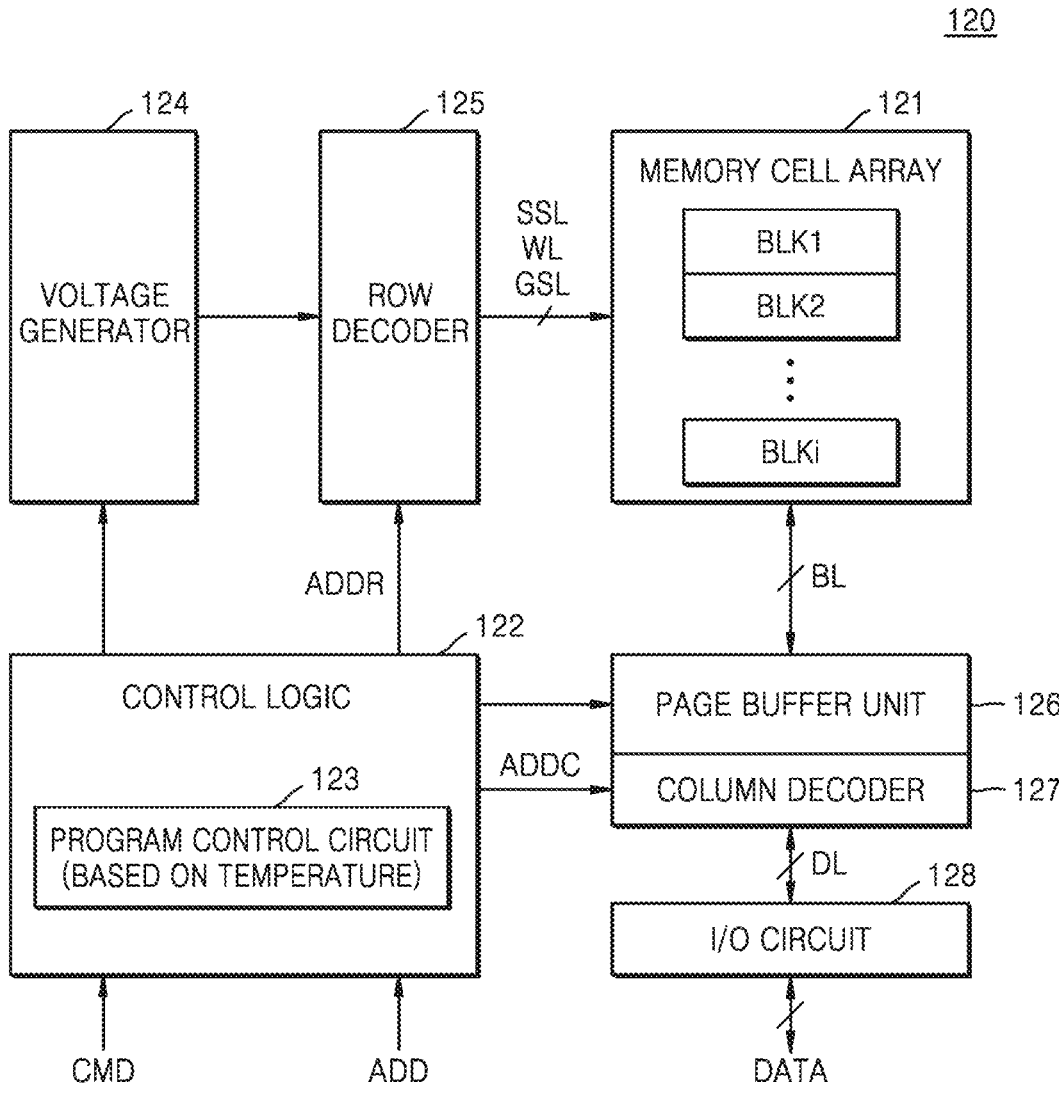
FIG. 3 is a detailed block diagram of a memory device of FIG. 1 according to some embodiments.

FIG. 3 is a detailed block diagram of the memory device 120 of FIG. 1 according to some embodiments.

Referring to FIG. 3, the memory device 120 may include the memory cell array 121, a control logic 122, a voltage generator 124, a row decoder 125, a page buffer unit 126, a column decoder 127, and an input/output (I/O) circuit 128.

In some embodiments, the control logic 122 may include the program control circuit 123. The control logic 122 may receive a command CMD and an address ADD from the controller 110 (see FIG. 1). The command CMD may be a signal instructing a read operation, a program operation (e.g., a high-reliability program operation or a normal program operation), an erase operation, or the like. The address ADD may include a row address ADDR and a column address ADDC.

In some embodiments, the program control circuit 123 may perform any one of the above-described high-reliability program operations and/or normal program operations for performing a temperature-based program operation. For example, the program control circuit 123 may perform a first high-reliability program operation based on program parameters set to first values in the high temperature range, may perform a second high-reliability program operation based on program parameters set to second values in the low temperature range, and may perform a normal program operation based on program parameters set to third values in the normal range. In addition, an operation of the program control circuit 123 may be understood as an operation of the control logic 122.

In some embodiments, the program parameters may include parameters related to adjustable points in program operation, such as parameters related to the number of program loops, or parameters related to the voltage level of a program or verify voltage. In some embodiments, the first, second, or third values of the program parameters may be adjusted according to an operating environment of the memory device 120, for example, a P/E cycle, an operating temperature, or characteristics of the memory cells. Furthermore, the values of the program parameters may be preset such that the high temperature range or the low temperature range is subdivided into sub-ranges, and thus, a high-reliability program operation corresponding to each of the sub-ranges may be performed by the program control circuit 123.

The voltage generator 124 may control voltages (e.g., program voltages, verify voltages, or erase voltages) applied to the memory cell array 121 through the row decoder 125 under control of the control logic 122.

The row decoder 125 may receive the row address ADDR from the control logic 122. The row decoder 125 may be connected to the memory cell array 121 through string select lines SSL, word lines WL, and ground select lines GSL. The row decoder 125 may decode the row address ADDR and control voltages applied to the string select lines SSL, the word lines WL, and the ground select lines GSL based on a result of the decoding and a voltage received from the voltage generator 124.

The memory cell array 121 may include a plurality of memory blocks BLK1 to BLKi. The memory blocks BLK1 to BLKi may be physical erase units of the memory device 120. In the present specification, embodiments in which a high-reliability program operation is controlled by performing management in memory block units are mainly disclosed, but the inventive concept are not limited thereto, and the high-reliability program operation may be performed by performing management in page units, word line units, sub-block units, or the like.

The memory blocks BLK1 to BLKi may include a plurality of memory cells. In some embodiments, each of the memory blocks BLK1 to BLKi may be operated as any one of a single-level cell, a multi-level cell, a triple-level cell, a quadruple-level cell, and the like.

The page buffer unit 126 may include a plurality of page buffers. The page buffer unit 126 may be connected to the memory cell array 121 through bit lines BL. The page buffer unit 126 may read data from the memory cell array 121 in page units by detecting voltages of the bit lines BL, under control of the control logic 122.

The column decoder 127 may receive the column address ADDC from the control logic 122. The column decoder 127 may decode the column address ADDC and provide the I/O circuit 128 with data read by the page buffer unit 126 based on a result of the decoding. In addition, the column decoder 127 may receive data DATA from the I/O circuit 128 through data lines DL. The column decoder 127 may decode the column address ADDC and provide the page buffer unit 126 with the data DATA received from the I/O circuit 128 based on a result of the decoding. The page buffer unit 126 may store the data provided from the I/O circuit 128, through the bit lines BL in the memory cell array 121 in page units.

The I/O circuit 128 may be connected to the column decoder 127 through the data lines DL. The I/O circuit 128 may transfer data received from the controller 110 (see FIG. 1), to the column decoder 127 through the data lines DL. The I/O circuit 128 may output the data DATA received through the data lines DL, to the controller 110 (see FIG. 1).

Figure 4A:
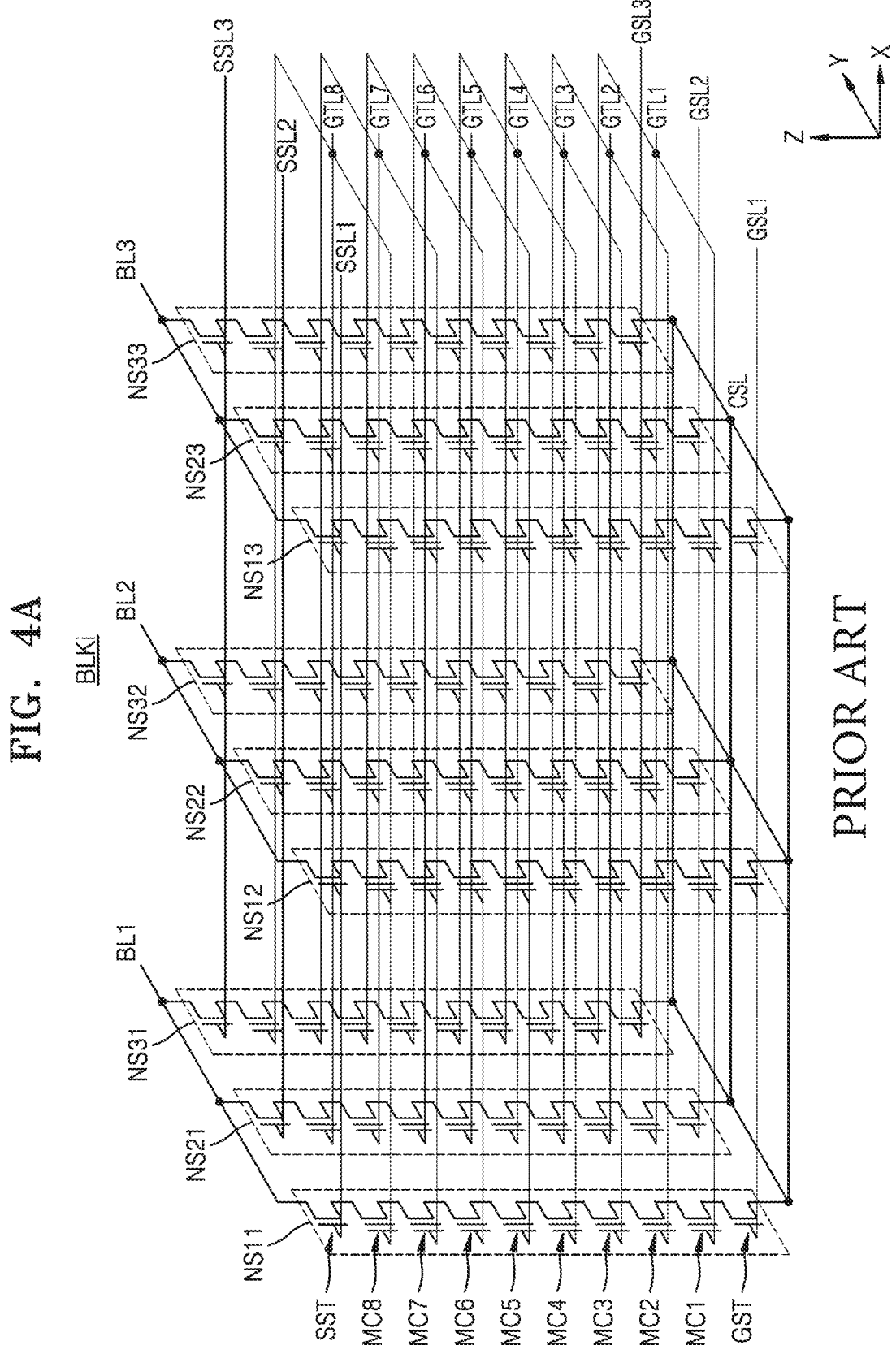
FIGS. 4A and 4B are diagrams for describing a three-dimensional V-NAND structure that may be applied to a storage device of FIG. 1.
Figure 4B:
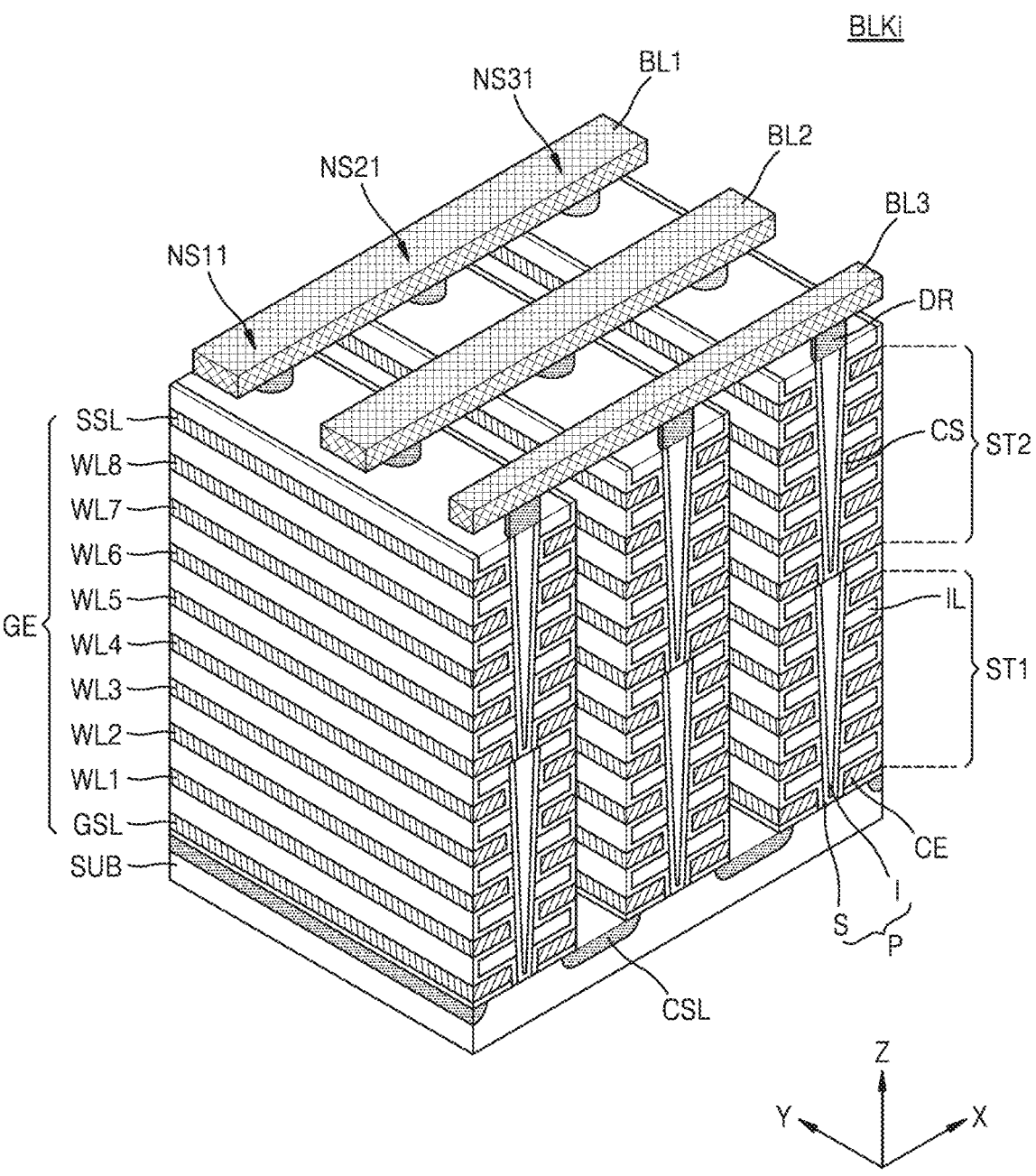

FIGS. 4A and 4B are diagrams for describing a three-dimensional V-NAND structure that may be applied to the storage device 100 of FIG. 1. FIGS. 4A and 4B illustrate a structure of the memory block BLKi of FIG. 3.

Referring to FIG. 4A, the memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1 to MC8, and a ground select transistor GST. For brevity of the drawing, FIG. 4A illustrates that each of the plurality of memory NAND strings NS11 to NS33 includes eight memory cells MC1 to MC8, but the inventive concept is not limited thereto.

The string select transistor SST may be connected to the corresponding string select line SSL1, SSL2, or SSL3. The plurality of memory cells MC1 to MC8 may be connected to corresponding gate lines GTL1 to GTL8, respectively. The gate lines GTL1 to GTL8 may correspond to word lines, and some of the gate lines GTL1 to GTL8 may correspond to dummy word lines. The ground select transistor GST may be connected to a corresponding ground select line GSL1, GSL2, or GSL3. The string select transistor SST may be connected to the corresponding bit line BL1, BL2, or BL3, and the ground select transistor GST may be connected to the common source line CSL.

Gate lines (e.g., GTL1) at the same height may be connected in common, and the ground selection lines GSL1, GSL2, and GSL3 and the string selection lines SSL1, SSL2, and SSL3 may be separated from each other. FIG. 4A illustrates that the memory block BLKi is connected to eight gate lines GTL1 to GTL8 and three bit lines BL1, BL2, and BL3, but the inventive concept is not limited thereto.

Referring further to FIG. 4B, the memory block BLKi is formed in a direction perpendicular to a substrate SUB. Memory cells included in the memory NAND strings NS11 to NS33 are formed by stacking on a plurality of semiconductor layers.

The common source line CSL extending in a first direction (Y direction) is provided on the substrate SUB. A plurality of insulating layers IL extending in the first direction (Y direction) may be sequentially provided in a third direction (Z direction) on a region of the substrate SUB between two adjacent common source lines CSL, and the plurality of insulating layers IL may be spaced a particular distance from each other in the third direction (Z direction). A plurality of pillars P may be sequentially arranged in the first direction (Y direction) on a region of the substrate SUB between two adjacent common source lines CSL, to penetrate the plurality of insulating layers IL in the third direction (Z direction). The plurality of pillars P may penetrate the plurality of insulating layers IL to be in contact with the substrate SUB. A surface layer S of each pillar P may include a silicon material doped into a first conductivity type and may function as a channel region.

An inner layer I of each pillar P may include an insulating material, such as silicon oxide, or an air gap. In a region between two adjacent common source lines CSL, a charge storage layer CS is provided along exposed surfaces of the insulating layers IL, the pillars P, and the substrate SUB. The charge storage layer CS may include a gate insulating layer (also referred to as a 'tunneling insulating layer'), a charge trapping layer, and a blocking insulating layer. In addition, in a region between two adjacent common source lines CSL, gate electrodes GE such as the select lines GSL and SSL and word lines WL1 to WL8 are provided on the exposed surface of the charge storage layer CS. Drains or drain contacts DR may be provided on the plurality of pillars P, respectively. The bit lines BL1 to BL3 extending in a second direction (X direction) and spaced by a particular distance from each other in the first direction (Y direction) may be provided on the drain contacts DR.

As illustrated in FIG. 4B, each of the memory NAND strings NS11 to NS33 may be implemented in a structure in which a first memory stack ST1 and a second memory stack ST2 are stacked. The first memory stack ST1 is connected to the common source line CSL, the second memory stack ST2 is connected to the bit lines BL1 to BL3, and the first memory stack ST1 and the second memory stack ST2 are stacked to share a channel hole with each other.

Figure 5:
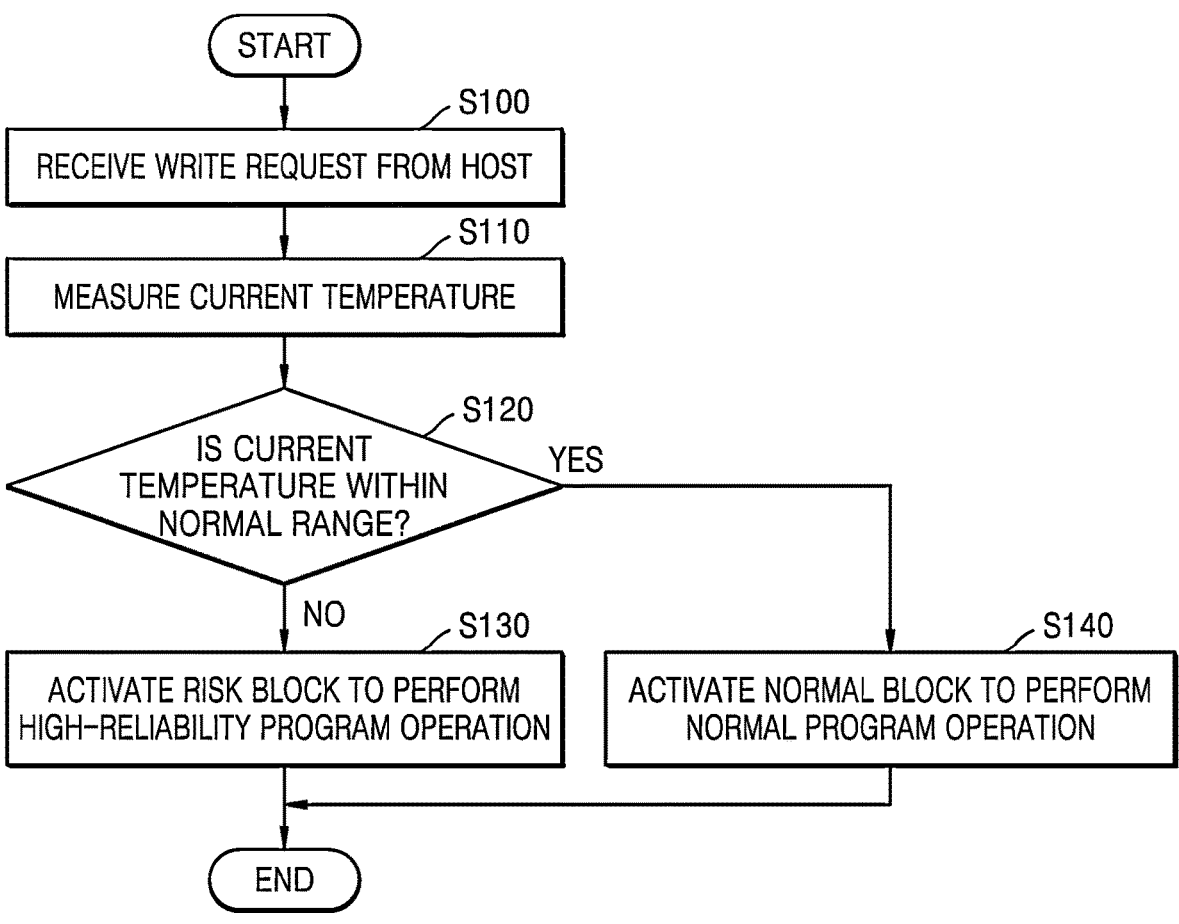
FIG. 5 is a flowchart for describing an operation method of a storage device according to some embodiments.

FIG. 5 is a flowchart for describing an operation method of a storage device according to some embodiments.

Referring to FIG. 5, in operation S100, the storage device may receive a write request from a host.

In operation S110, the storage device may measure the current temperature of the storage device before controlling a program operation in response to the received write request. The storage device may measure the temperature of the storage device through at least one temperature sensor arranged therein.

In operation S120, the storage device may determine whether the current temperature measured in operation S110 is within the normal range. The normal range and the abnormal range may be preset, and a temperature outside the normal range may be determined to be within the abnormal range. As described above, the abnormal range may include the high temperature range and the low temperature range.

When a result of the determination in operation S120 is 'NO', in operation S130, the storage device may activate a risk block to perform a high-reliability program operation according to the write request. In detail, the storage device may dynamically select any one of memory blocks of the memory device as a risk block, perform the high-reliability program operation by using the selected memory block, and store information indicating that the selected memory block has been selected as a risk block, in a block management table.

When the result of the determination in operation S120 is 'YES', in operation S140, the storage device may activate a normal block to perform a normal program operation according to the write request. In detail, the storage device may dynamically select any one of the memory blocks of the memory device as a normal block, perform the normal program operation by using the selected memory block, and store information indicating that the selected memory block has been selected as a normal block, in the block management table.

Figure 6:
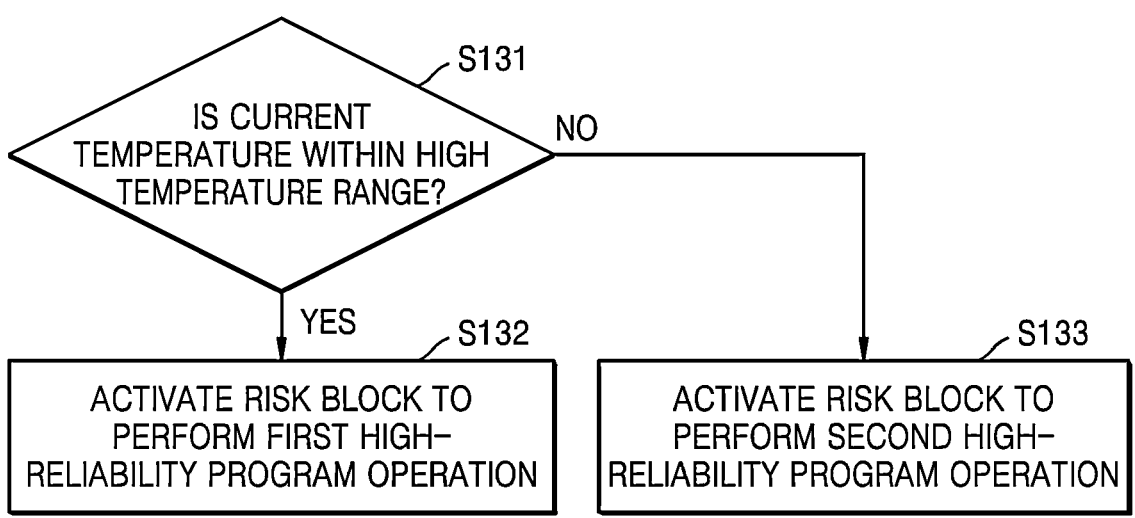
FIG. 6 is a flowchart for describing in detail an operation method of a storage device in operation S130 of FIG. 5.

FIG. 6 is a flowchart for describing in detail an operation method of a storage device in operation S130 of FIG. 5.

Referring to FIG. 6, operation S130 of FIG. 5 may include operations S131 to S133.

In operation S131, the storage device may determine whether the current temperature measured in operation S110 of FIG. 5 is within the high temperature range.

When a result of the determination in operation S131 is 'YES', in operation S132, the storage device may activate a risk block to perform a first high-reliability program operation.

When the result of the determination in operation S131 is 'NO', in operation S133, the storage device may determine that the current temperature is within the low temperature range and activate a risk block to perform a second high-reliability program operation.

Figure 7:
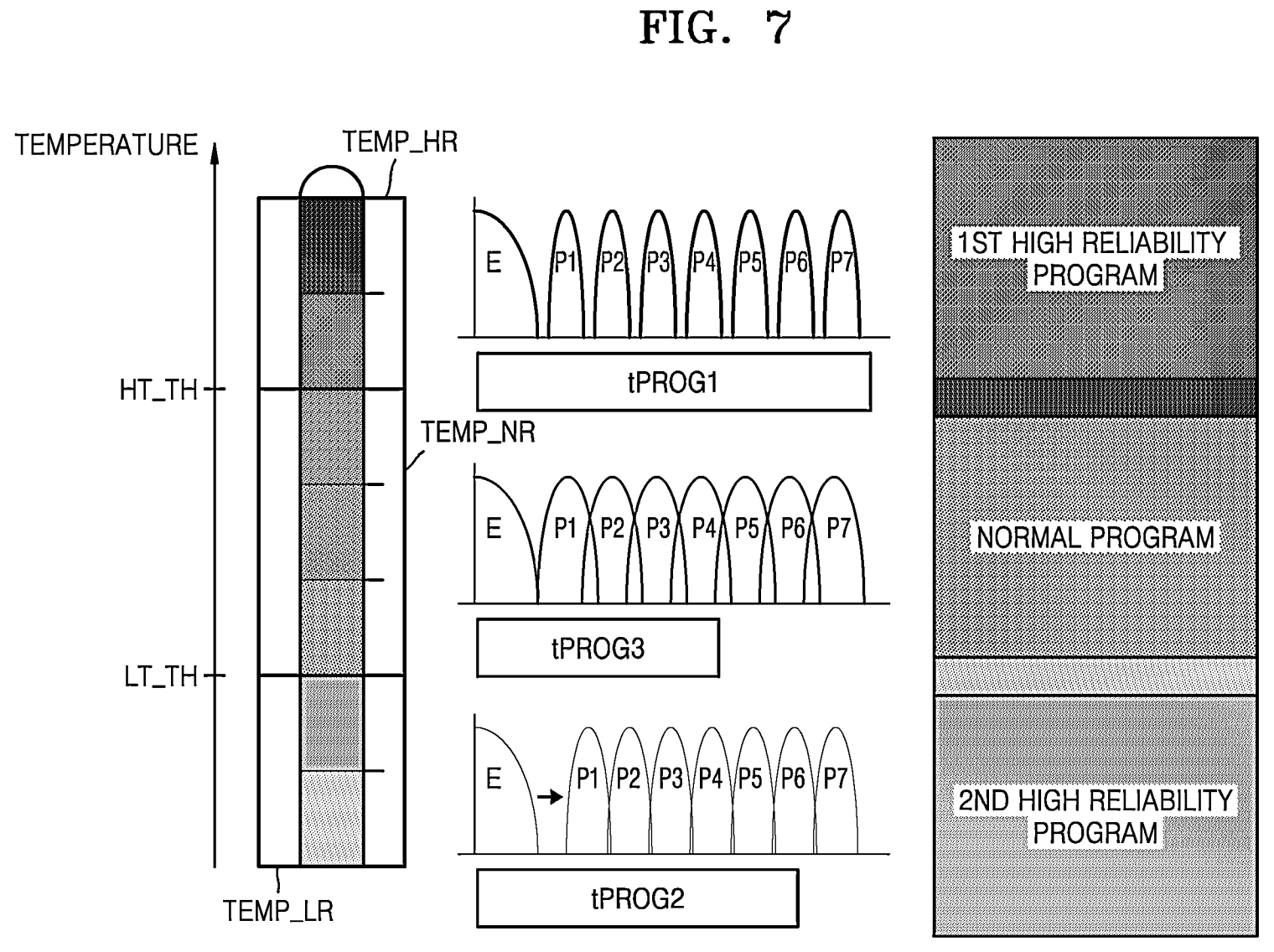

FIG. 7 is a diagram for describing in detail a program operation according to some embodiments. FIG. 7 illustrates an example of a program operation on memory cells operated as triple-level cells, but the inventive concept is not limited thereto and may also be applied to a program operation on memory cells operated as single-level cells, multi-level cells, quadruple-level cells, or the like.

Referring to FIG. 7, a temperature range at which the storage device is operable may include a normal range TEMP_NR, a high temperature range TEMP_HR, and a low temperature range TEMP_LR, and the high temperature range TEMP_HR and low temperature range TEMP_LR may be included in the abnormal range. The high temperature range TEMP_HR may be determined according to a first threshold temperature HT_TH, and the low temperature range TEMP_LR may be determined according to a second threshold temperature LT_TH.

In some embodiments, the storage device may perform a first high-reliability program operation at a temperature within the high temperature range TEMP_HR, perform a second high-reliability program operation at a temperature within the low temperature range TEMP_LR, and perform a normal program operation at a temperature within the normal range TEMP_NR.

In some embodiments, threshold voltage distributions of an erased state E and program states P1 to P7 formed by the first high-reliability program operation may have a sharper shape than threshold voltage distributions formed by the second high-reliability program operation and the normal program operation.

In some embodiments, a gap between the threshold voltage distribution of the erased state E and the threshold voltage distribution of the first program state P1 that are formed by the second high-reliability program operation may be greater than those in the first high-reliability program operation and the normal program operation.

In some embodiments, when programming the same amount of data, a second programming time period tPROG2 required for performing the second high-reliability program operation may be longer than a third programming time period tPROG3 required for performing the normal program operation, and a first programming time period tPROG1 required for performing the first high-reliability program operation may be longer than the second programming time period tPROG2.

In some embodiments, when programming the same amount of data, the number of program loops performed in the second high-reliability program operation may be greater than the number of program loops performed in the normal program operation, and the number of program loops performed in the first high-reliability program operation may be greater than the number of program loops performed in the second high-reliability program operation.

In addition, in some embodiments, in the first high-reliability program operation, the second high-reliability program operation, and the normal program operation, at least one of voltage offsets, the levels of program voltages, and the voltage levels of verify voltages in an incremental step pulse program (ISPP) scheme may be different from each other.

Figure 8A:
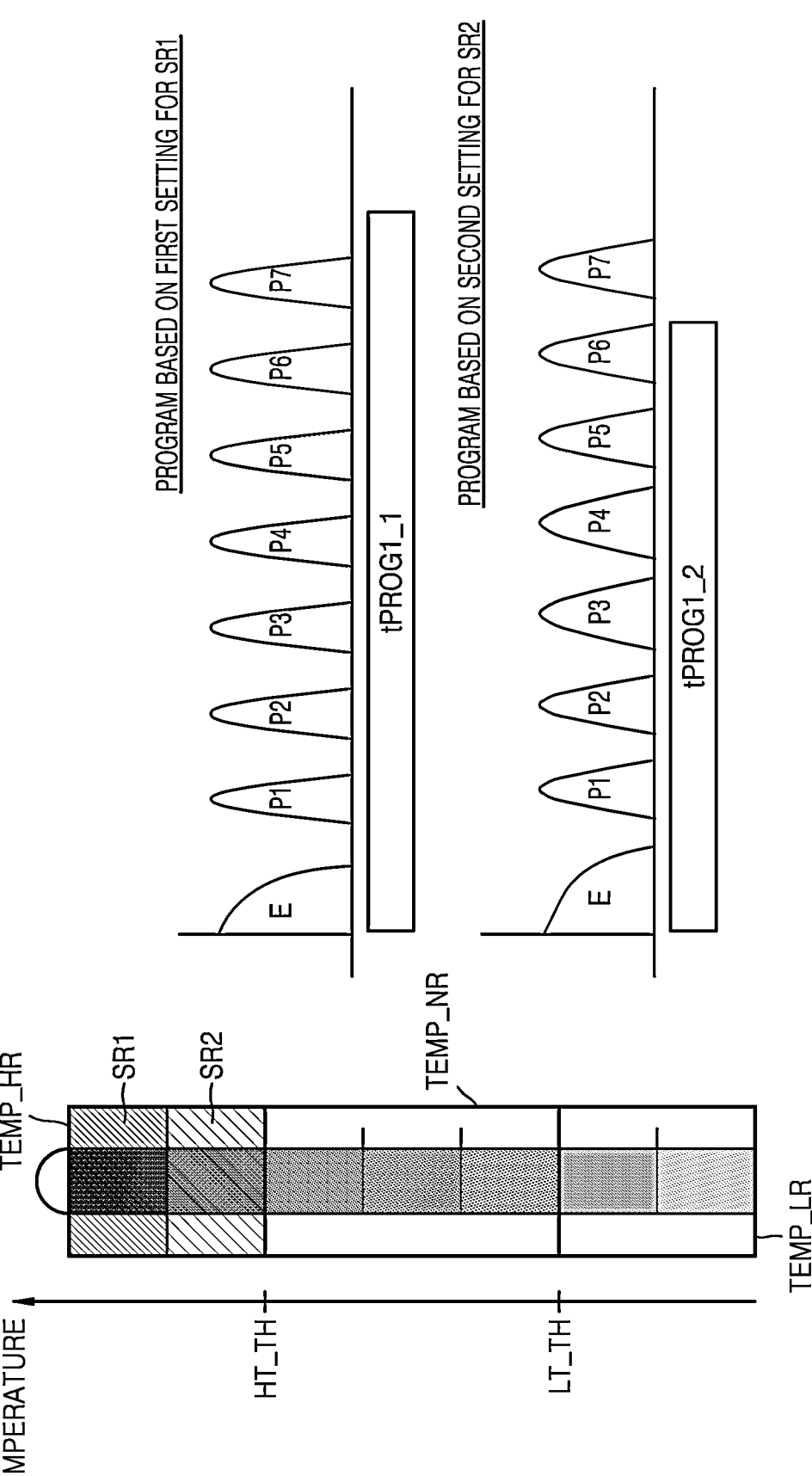
FIGS. 8A and 8B are diagrams for describing in detail first and second high-reliability program operations according to some embodiments.
Figure 8B:
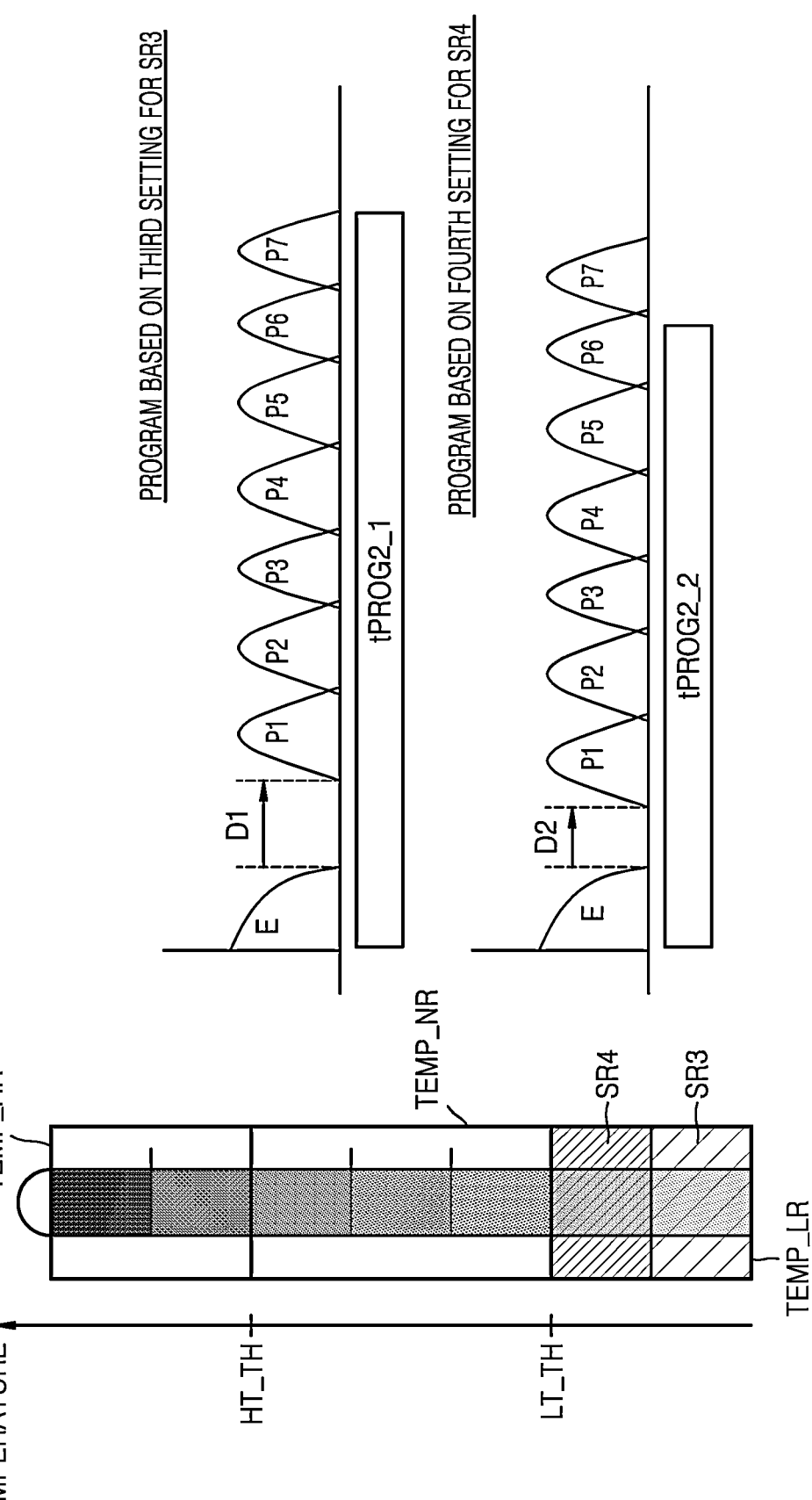

FIGS. 8A and 8B are diagrams for describing in detail first and second high-reliability program operations according to some embodiments.

Referring to FIG. 8A, the high temperature range TEMP_HR may include first and second sub-ranges SR1 and SR2. The storage device may perform the first high-reliability program operation based on a first setting in the first sub-range SR1, and the first high-reliability program operation based on a second setting in the second sub-range SR2.

In some embodiments, threshold voltage distributions of an erased state E and program states P1 to P7 formed by the first high-reliability program operation based on the first setting may have a sharper shape than threshold voltage distributions formed by the first high-reliability program operation based on the second setting. In addition, when programming the same amount of data, a first programming time period tPROG1_1 required for performing the first high-reliability program operation based on the first setting may be longer than a second programming time period tPROG1_2 required for performing the first high-reliability program operation based on the second setting.

To this end, the first setting may be set to have a larger number of program loops than that of the second setting, and furthermore, the first setting may be set to have a smaller voltage offset in an ISPP scheme than that of the second setting.

The embodiment illustrated in FIG. 8A is an example and the inventive concept is not limited thereto, and the storage device may subdivide the high temperature range TEM- P_HR into three or more sub-ranges so as to perform the first high-reliability program operation according to various settings.

Referring further to FIG. 8B, the low temperature range TEMP_LR may include third and fourth sub-ranges SR3 and SR4. The storage device may perform the second high-reliability program operation based on a third setting in the third sub-range SR3, and the second high-reliability program operation based on a fourth setting in the fourth sub-range SR4.

In some embodiments, a first gap D1 between a threshold voltage distribution of the erased state E and a threshold voltage distribution of the first program state P1 that are formed by the second high-reliability program operation based on the third setting may be greater than a second gap D2 in the second high-reliability program operation based on the fourth setting. In addition, when programming the same amount of data, a second programming time period tPROG2_1 required for performing the second high-reliability program operation based on the third setting may be longer than a second programming time period tPROG2_2 required for performing the second high-reliability program operation based on the fourth setting.

To this end, the third setting may be set such that the voltage level of a verify voltage for distinguishing between the erased state E and the first program state P1 is higher than that of the fourth setting, and furthermore, the third setting may be set to have a greater number of program loops than that of the fourth setting.

The embodiment illustrated in FIG. 8B is an example and the inventive concept is not limited thereto, and the storage device may subdivide the low temperature range TEMP_LR into three or more sub-ranges so as to perform the second high-reliability program operation according to various settings.

Figure 9A:
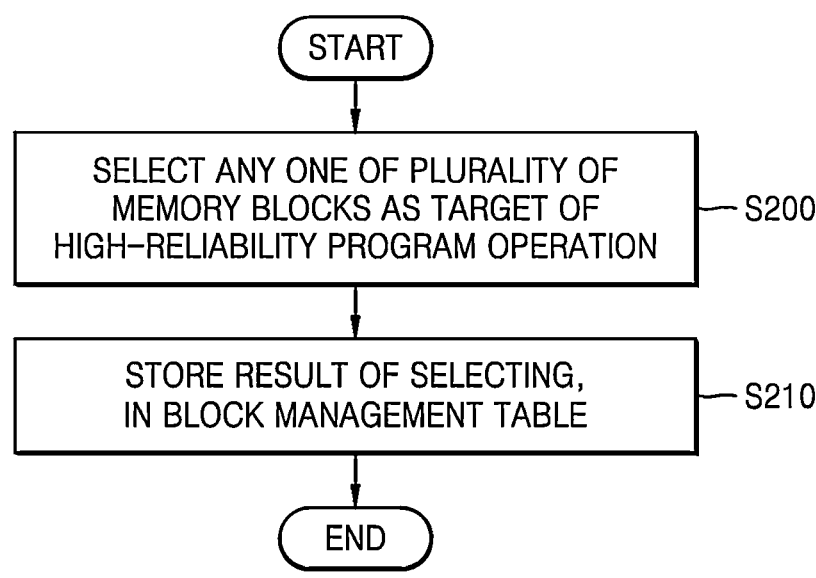
FIG. 9A illustrates an operation method of a storage device in a high temperature range, according to some embodiments.

FIG. 9A illustrates an operation method of a storage device in a high temperature range, according to some embodiments, and FIGS. 9B and 9C are diagrams for describing block management tables TB1_1A and TB1_1B according to some embodiments.

Referring to FIG. 9A, in operation S200, when the current temperature is within the high temperature range, the storage device may select any one of a plurality of memory blocks as a target of a high-reliability program operation. That is, the storage device may activate any one of the plurality of memory blocks as a risk block.

In operation S210, the storage device may store a result of the selecting of operation S200, in a block management table.

Referring further to FIG. 9B, the block management table TB1_1A may include block numbers for identifying the respective memory blocks, and type indications of the types of the respective memory blocks. In some embodiments, the block management table TB1_1A may include information indicating that the memory block with a block number of '#1' is of a normal block type TYPE_1, and information indicating that the memory blocks with block numbers of '#2' and '#3' are of a risk block type TYPE_2.

Referring further to FIG. 9C, unlike the table of FIG. 9B, the block management table TB1_1B may include information distinguishing between memory blocks activated as risk blocks in the high temperature range, and memory blocks activated as risk blocks in the low temperature range. In some embodiments, the block management table TB1_1B may include information indicating that the memory block with a block number of '#2' is of the risk block type TYPE_2 activated in the high temperature range, and information indicating that the memory block with a block number of '#3' is of a risk block type TYPE_3 activated in the low temperature range.

Figure 10:
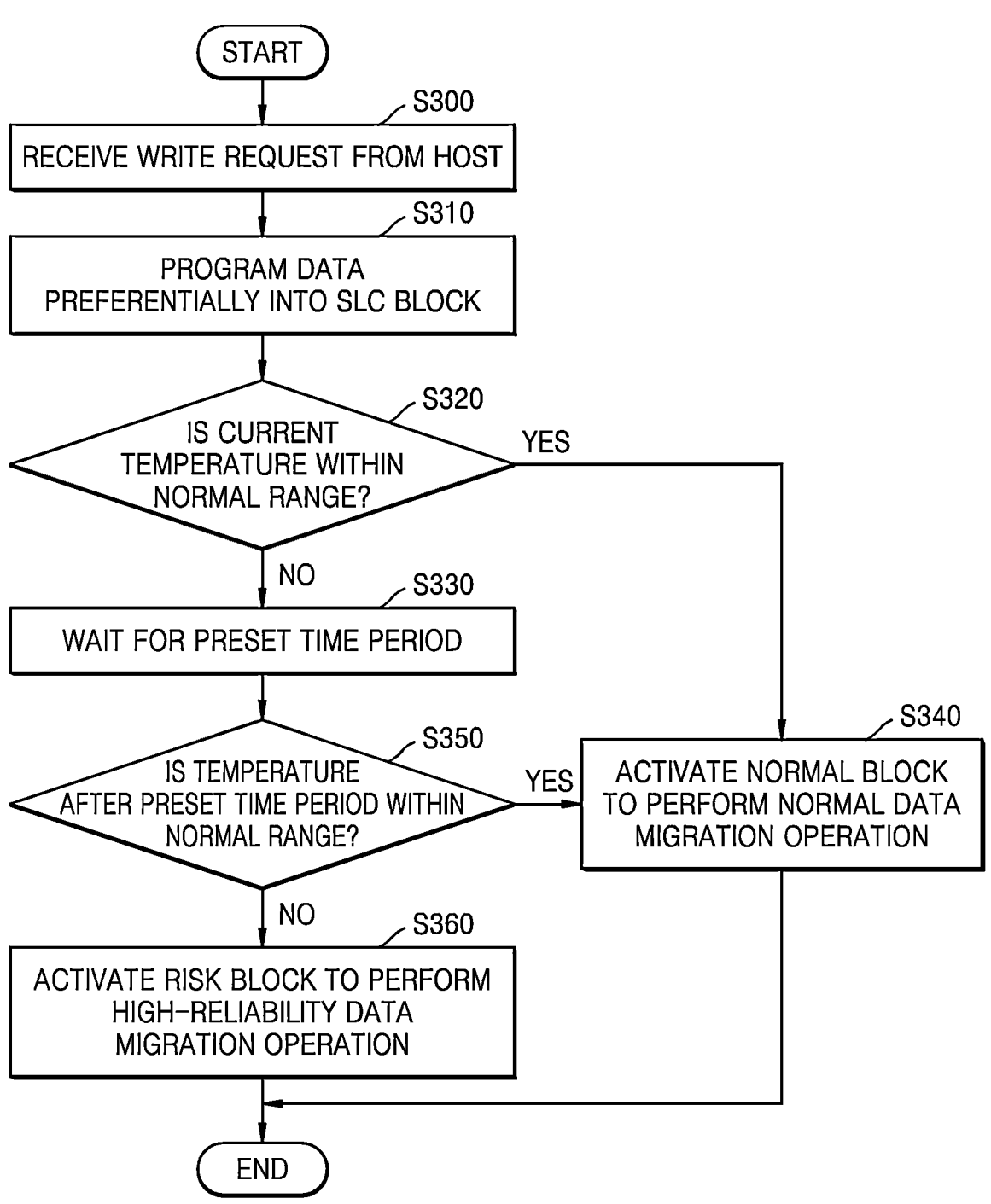
FIG. 10 is a flowchart for describing an operation method of a storage device according to some embodiments.

FIG. 10 is a flowchart for describing an operation method of a storage device according to some embodiments.

Referring to FIG. 10, in operation S300, the storage device may receive a write request from a host.

In operation S310, in response to the write request received in operation S300, the storage device may program data received from the host preferentially into a single-level cell (SLC) block among a plurality of memory blocks of the memory device. In the present specification, the SLC block may be defined as a memory block operated as a SLC.

In operation S320, the storage device may determine whether the current temperature is within the normal range, before performing an operation of migrating data stored in the SLC block to a multi-level cell (MLC) block. In the present specification, the MLC block may be defined as a memory block operated as a MLC. In some embodiments, the MLC block that is the destination of the data migration operation may be replaced with a triple-level cell (TLC) block or a quadruple-level cell (QLC) block. In addition, in some embodiments, the SLC block on which a program operation is preferentially performed may be replaced with an MLC block, and in this case, the MLC block that is the destination of the data migration operation may be replaced with a memory block operated as a higher level cell than the MLC.

When a result of the determination in operation S320 is 'NO', in operation S330, the storage device may wait for a preset time period such that the temperature within the abnormal range stabilizes.

When the result of the determination in operation S320 is 'YES', in operation S340, the storage device may activate a normal block to perform a normal data migration operation. As a specific example, the storage device may activate any one of the plurality of memory blocks as a normal block and migrate data stored in the SLC block to the activated normal block as a destination. The normal data migration operation may include the above-described normal program operation using a normal block.

In operation S350, the storage device may determine once again whether the temperature after waiting in operation S330 is within the normal range.

When a result of the determination in operation S350 is 'NO', in operation S360, the storage device may activate a risk block to perform a high-reliability data migration operation. As a specific example, the storage device may activate any one of the plurality of memory blocks as a risk block and migrate data stored in the SLC block to the activated risk block as a destination. The high-reliability data migration operation may include the above-described high-reliability program operation using a risk block.

When the result of the determination in operation S350 is 'YES', operation S340 may be performed. The detailed description of operation S340 is described above and thus will be omitted.

Figure 11:
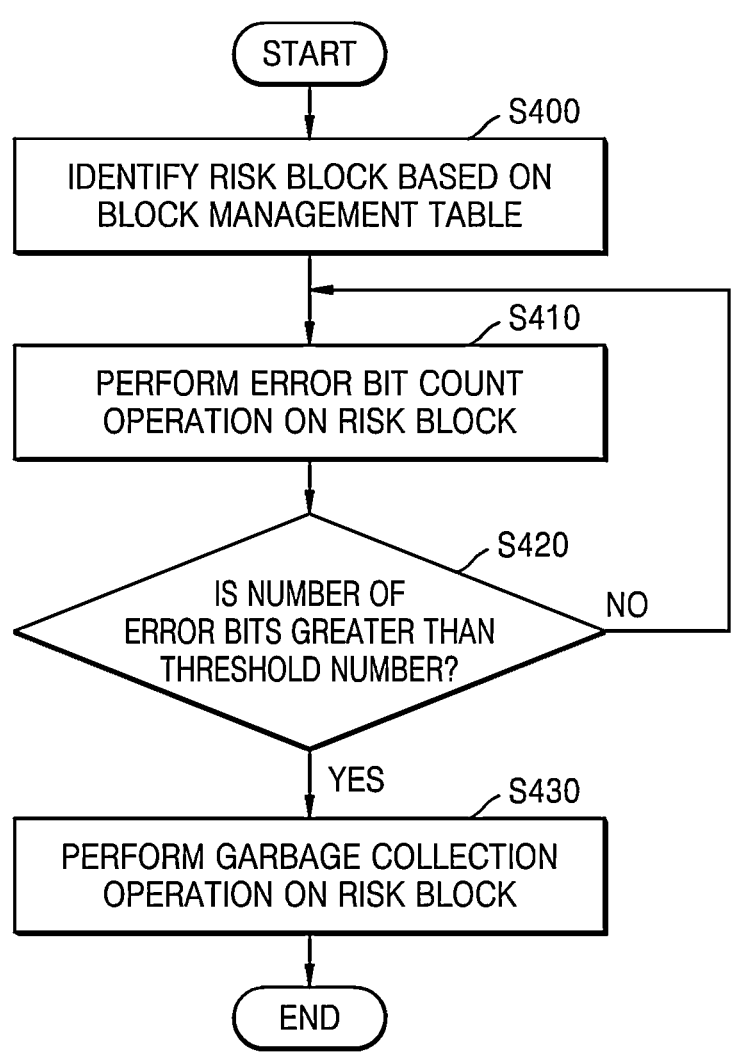
FIG. 11 is a flowchart for describing a garbage collection operation of a storage device according to some embodiments.

FIG. 11 is a flowchart for describing a garbage collection operation of a storage device according to some embodiments.

Referring to FIG. 11, in operation S400, the storage device may identify a risk block based on a block management table. As a specific example, the block management table may include information indicating whether any one of a plurality of memory blocks of the memory device is of a normal block type or a risk block type, and the storage device may identify the block number of a memory block of the risk block type, from the block management table.

In operation S410, the storage device may perform an error bit count operation on the risk block identified in operation S400. As a specific example, the storage device may read data stored in the risk block and correct an error in the read data. The storage device may count different bits between the error-corrected data and the read data, as error bits.

In operation S420, the storage device may determine whether the number of error bits counted in operation S410 is greater than a threshold number.

When a result of the determination in operation S420 is 'YES', in operation S430, the storage device may perform a garbage collection operation on the risk block.

When the result of the determination in operation S420 is 'NO', operation S410 may be performed after a preset time period.

Figure 12A:
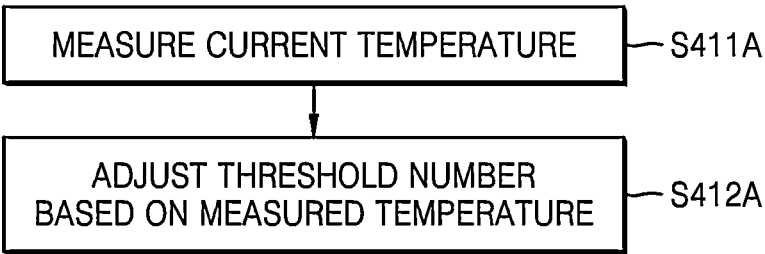
FIGS. 12A and 12B are flowcharts for describing an operation method of a storage device in operation S410 of FIG. 11.
Figure 12B:
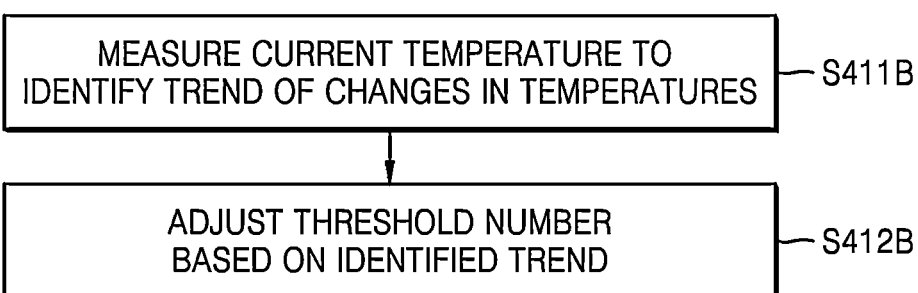

FIGS. 12A and 12B are flowcharts for describing an operation method of a storage device in operation S410 of FIG. 11.

Referring to FIG. 12A, operation S410 of FIG. 11 may include operations S411A and S412A.

In operation S411A, the storage device may measure the current temperature of the storage device for performing the garbage collection operation.

In operation S412A, the storage device may adjust the threshold number based on the temperature measured in operation S411A. As a specific example, the storage device may adjust the threshold number to decrease as the measured temperature increases. In some embodiments, the storage device may adjust the threshold number to increase as the measured temperature increases. As such, the storage device may adjust a condition under which the garbage collection operation on the risk block is performed according to the measured temperature.

Referring further to FIG. 12B, operation S410 of FIG. 11 may include operations S411B and S412B.

In operation S411B, the storage device may measure the current temperature of the storage device for performing the garbage collection operation, and identify a trend of changes in previously measured temperatures.

In operation S412B, the storage device may adjust the threshold number based on the trend identified in operation S411B. As a specific example, the storage device may adjust the threshold number to decrease when the temperature tends to change rapidly. As such, the storage device may guarantee a certain level of data reliability by quickly responding to sudden changes in temperature to perform the garbage collection operation.

Figure 13A:
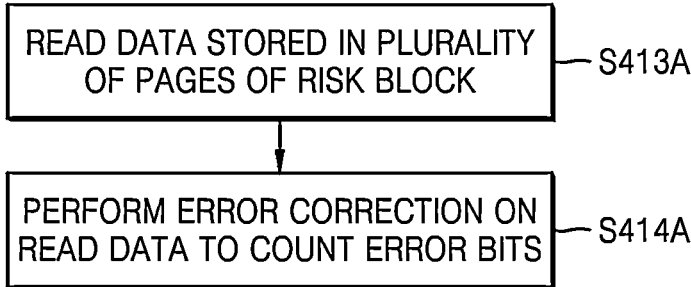
FIGS. 13A and 13B are flowcharts for describing in detail an operation method of a storage device in operation S410 of FIG. 11.
Figure 13B:
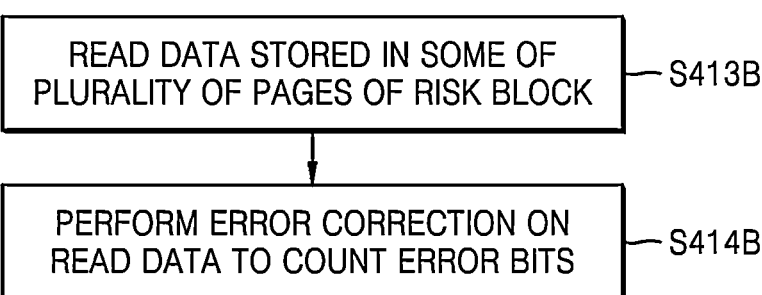

FIGS. 13A and 13B are flowcharts for describing in detail an operation method of a storage device in operation S410 of FIG. 11.

Referring to FIG. 13A, operation S410 of FIG. 11 may include operations S413A and S414A.

In operation S413A, the storage device may read data stored in a plurality of pages of the risk block.

In operation S414A, the storage device may perform error correction on the data read in operation S413A to count error bits.

Referring further to FIG. 13B, operation S410 of FIG. 11 may include operations S413B and S414B.

In operation S413B, the storage device may read data stored in some of the plurality of pages of the risk block. In some embodiments, the pages from which the data is read may include memory cells with poor characteristics, and may be predetermined.

In operation S414B, the storage device may perform error correction on the data read in operation S413B to count error bits. As such, the storage device may perform a fast and accurate error bit count operation by intensively using data in pages with poor characteristics. Meanwhile, the threshold number in FIG. 13A may be greater than the threshold number in FIG. 13B.

Figure 14:
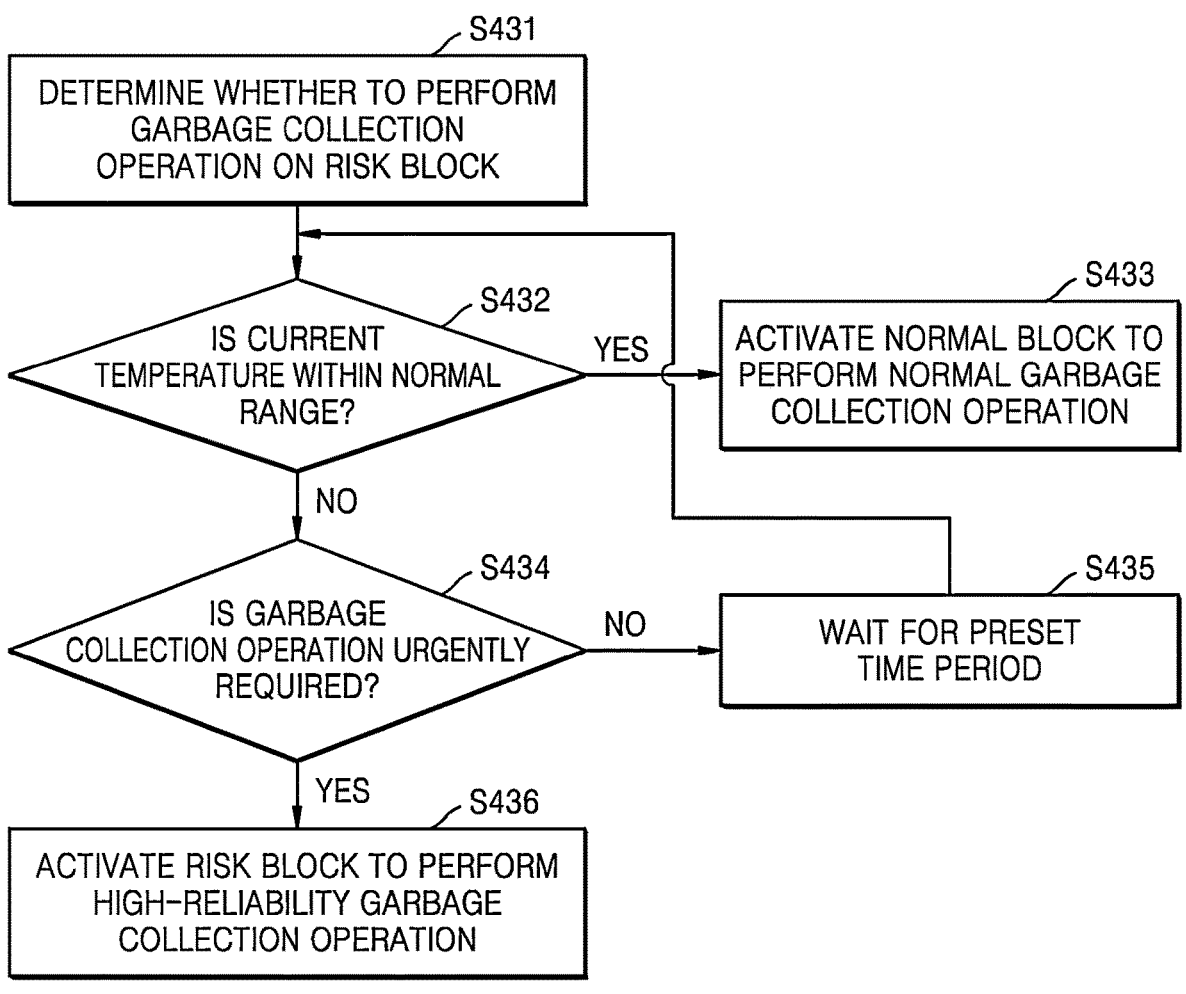
FIG. 14 is a flowchart for describing a garbage collection operation of a storage device according to some embodiments.

FIG. 14 is a flowchart for describing a garbage collection operation of a storage device according to some embodiments.

Referring to FIG. 14, in operation S431, the storage device may determine whether to perform a garbage collection operation on a risk block.

In operation S432, the storage device may measure the current temperature for performing the garbage collection operation, and determine whether the measured current temperature is within the normal range.

When a result of the determination in operation S432 is 'YES', in operation S433, the storage device may activate a normal block to perform a normal garbage collection operation. In some embodiments, the normal garbage collection operation may include a normal program operation using a target block.

When the result of the determination in operation S432 is 'NO', in operation S434, the storage device may determine whether a garbage collection operation is urgently required. In some embodiments, the storage device may determine whether a garbage collection operation is urgently required, considering a request from the host, the available data capacity of the storage device, the temperature state of the storage device, and the like.

When a result of the determination in operation S434 is 'NO', in operation S435, the storage device may wait for a preset time period such that the temperature within the abnormal range stabilizes. Operation S435 may be followed by operation S432. The detailed description of operation S432 is described above and thus will be omitted.

When the result of the determination in operation S434 is 'YES', in operation S436, the storage device may activate the risk block to perform a high-reliability garbage collection operation. In some embodiments, the high-reliability garbage collection operation may include a high-reliability program operation using a target block.

FIGS. 15A and 15B are diagrams for describing a garbage collection operation of a storage device according to some embodiments. FIG. 15A illustrates the normal garbage collection operation performed in operation S433 of FIG. 14, and FIG. 15B illustrates the high-reliability garbage collection operation performed in operation S436 of FIG. 14.

Referring to FIG. 15A, the storage device may select a memory block with a block number of '#1' and corresponding to the risk block type TYPE_2, as a victim block VB, by referring to a block management table TB1_2A. The storage device may select an empty memory block with a block number of '#2' from among a plurality of memory blocks, as a target block TB.

In some embodiments, the storage device may perform a normal garbage collection operation by using the victim block VB and the target block TB. In detail, the storage device may store data A' and B' in the target block TB by copying data A and B of the victim block VB to the target block TB according to a normal program operation, and erase the victim block VB. In some embodiments, the storage device may store the data A' and B' generated by performing error correction on the data A and B of the victim block VB, in the target block TB according to the normal program operation.

In some embodiments, the storage device may update the block management table TB1_2A after performing the normal garbage collection operation. In detail, the storage device may initialize the type indication of the memory block with a block number of '#1' in the block management table TB1_2A, and store the type of the memory block with a block number of '#2' as the normal block type TYPE_1.

Referring further to FIG. 15B, unlike the example illustrated in FIG. 15A, the storage device may perform a high-reliability garbage collection operation by using the victim block VB and the target block TB. In detail, the storage device may store data A" and B" in the target block TB by copying the data A and B of the victim block VB to the target block TB according to a high-reliability program operation, and erase the victim block VB. In some embodiments, the storage device may store the data A" and B" generated by performing error correction on the data A and B of the victim block VB, in the target block TB according to the high-reliability program operation.

In some embodiments, the storage device may update a block management table TB1_2B after performing the high-reliability garbage collection operation. In detail, the storage device may initialize the type indication of the memory block with a block number of '#1' in the block management table TB1_2B, and store the type of the memory block with a block number of '#2' as the risk block type TYPE_2.

Figure 16:
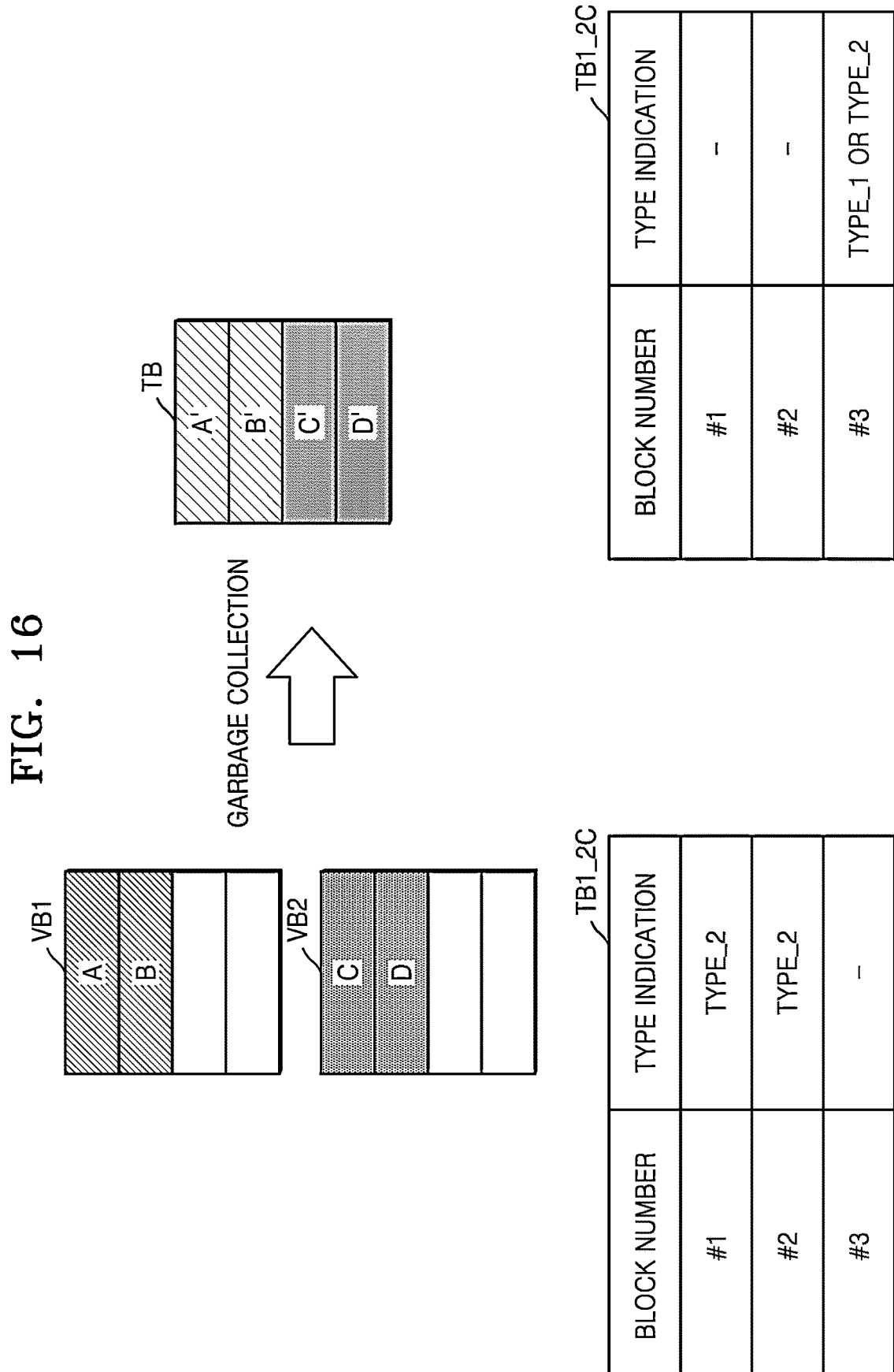
FIG. 16 is a diagram for describing a garbage collection operation of a storage device according to some embodiments.

FIG. 16 is a diagram for describing a garbage collection operation of a storage device according to some embodiments. FIG. 16 illustrates the garbage collection operation performed in operation S433 or operation S436 of FIG. 14.

Referring to FIG. 16, the storage device may select a memory block with a block number of '#1' and corresponding to the risk block type TYPE_2, and a memory block with a block number of '#2' and corresponding to the risk block type TYPE_2, as first and second victim blocks VB1 and VB2, respectively, by referring to a block management table TB1_2C. The storage device may select an empty memory block with a block number of '#2' from among a plurality of memory blocks, as a target block TB.

In some embodiments, the storage device may perform a garbage collection operation by using the first and second victim blocks VB1 and VB2 and the target block TB. In detail, the storage device may store data A', B', C', and D' in the target block TB by copying data A, B, C, and D of the first and second victim blocks VB1 and VB2 to the target block TB according to a normal or high-reliability program operation, and erase the victim block VB (i.e., first and second victim blocks VB1 and VB2). In some embodiments, the storage device may store, in the target block TB, the data A', B', C ', and D' generated by performing error correction on the data A, B, C, and D of the first and second victim blocks VB1 and VB2.

In some embodiments, the storage device may update the block management table TB1_2C after performing the garbage collection operation. In detail, the storage device may initialize the type indications of the memory blocks with block numbers of '#1' and '#2' in the block management table TB1_2C, and store the types of the memory block with a block number of '#3' as the normal block type TYPE_1 or the risk block type TYPE_2.

Meanwhile, in some embodiments, the second victim block VB2 is a normal block and may include a plurality of invalid pages, and through the garbage collection operation, the data C and D of the valid pages of the second victim block VB2 may be stored in the target block TB together with the data A and B of the first victim block VB1 that is a risk block.

Figure 17:
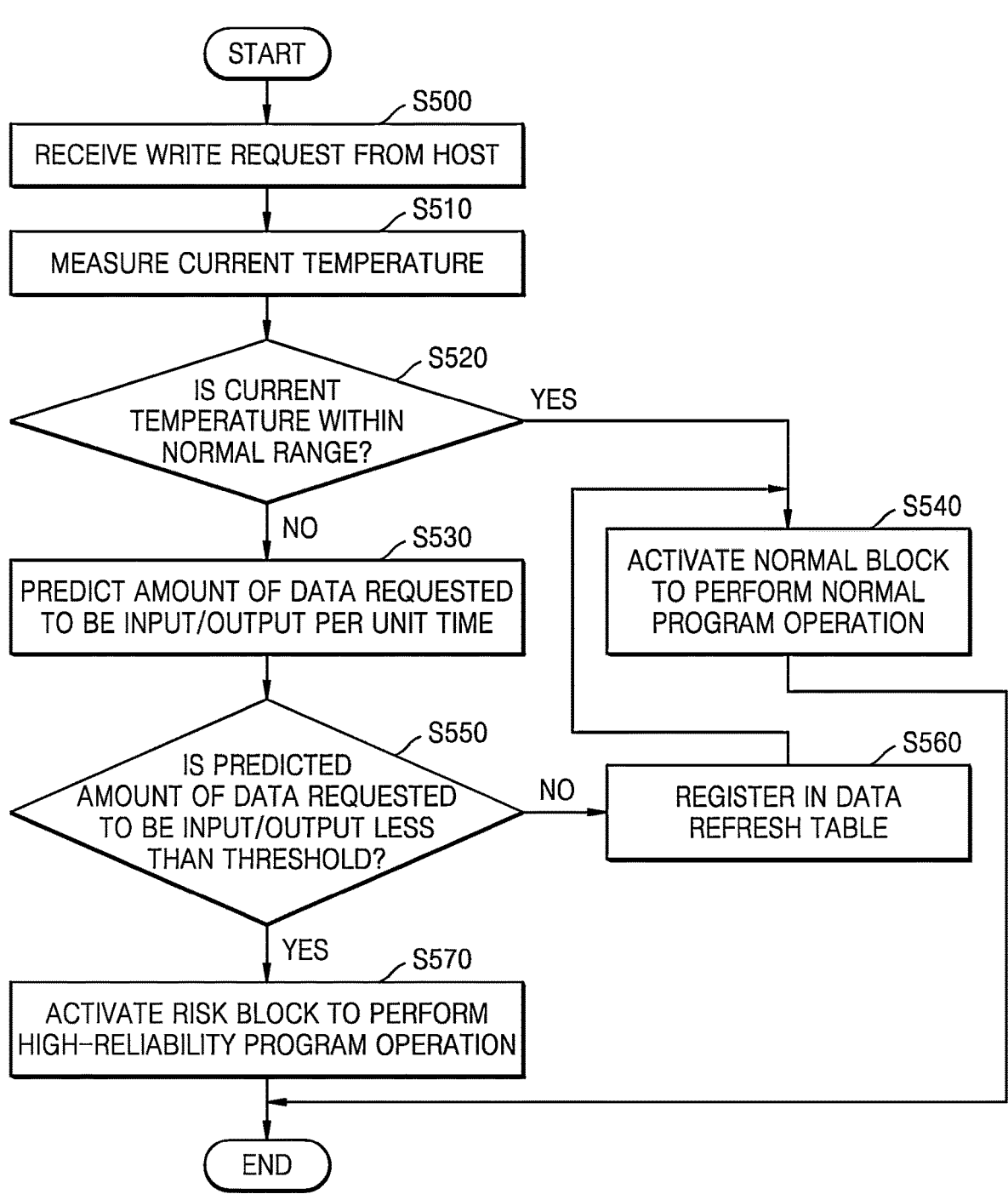
FIG. 17 is a flowchart for describing an operation method of a storage device according to some embodiments.

FIG. 17 is a flowchart for describing an operation method of a storage device according to some embodiments.

Referring to FIG. 17, in operation S500, the storage device may receive a write request from a host.

In operation S510, the storage device may measure the current temperature of the storage device before controlling a program operation in response to the received write request.

In operation S520, the storage device may determine whether the current temperature measured in operation S510 is within the normal range.

When a result of the determination in operation S520 is 'NO', in operation S530, the storage device may predict the amount of data requested by the host to be input/output per unit time. In some embodiments, the storage device may predict the amount of data requested to be input/output per unit time, based on the number of requests received from the host for a preset time period. In some embodiments, the storage device may predict the amount of data requested to be input/output per unit time based on signals received from the host.

The reason why the storage device predicts the amount of data requested to be input/output per unit time and considers the prediction in a program operation is because it is most important to support fast latency when the amount of data requested to be input/output per unit time is greater than or equal to a threshold. That is, as described above, when the amount of data requested to be input/output per unit time is greater than or equal to the threshold, it may be determined that the environment has a limited time period for programming, and thus, a normal program operation that requires a relatively short programming time period may be performed. However, this is only some embodiments, and the inventive concept is not limited thereto, and an environment in which the time period for programming is limited may be determined in various manners based on various criteria.

When the result of the determination in operation S520 is 'YES', in operation S540, the storage device may activate a normal block to perform a normal program operation according to the write request.

In operation S550, the storage device may determine whether the amount of data requested to be input/output predicted in operation S530 is less than the threshold.

When a result of the determination in operation S550 is 'NO', in operation S560, the storage device may store, in a data refresh table, information indicating that the predicted amount of data requested to be input/output is greater than or equal to the threshold, and thus, the normal program operation for fast latency even at a temperature within the abnormal range has been performed. In some embodiments, the data refresh table may be included in the block management table 113 of FIG. 1, and may be managed by the risk block management circuit 111 of FIG. 1. Thereafter, operation S540 may be performed, the detailed description of which is described above and thus will be omitted.

When the result of the determination in operation S550 is 'YES', in operation S570, the storage device may activate a risk block to perform a high-reliability program operation.

FIGS. 18A and 18B are flowcharts for describing an operation of managing a data refresh table of a storage device, according to some embodiments. FIG. 18A illustrates the normal program operation performed in operation S540 after operation S560 of FIG. 17, and FIG. 18B illustrates the high-reliability program operation performed in operation S570 of FIG. 17.

Referring to FIG. 18A, the storage device may perform the normal program operation by using the second memory block BLK2 with a block number of '#2' among the plurality of memory blocks BLK1 to BLKi. Thereafter, the storage device may store, in a block management table TB1, information indicating that the second memory block BLK2 with a block number of '#2' corresponds to the normal block type TYPE_1, and store, in a data refresh table TB2, a value 'V2' indicating that a data refresh operation is required for the second memory block BLK2 with a block number of '#2'.

Referring further to FIG. 18B, the storage device may perform the high-reliability program operation by using the second memory block BLK2 with a block number of '#2' among the plurality of memory blocks BLK1 to BLKi. Thereafter, the storage device may store, in the block management table TB1, information indicating that the second memory block BLK2 with a block number of '#2' corresponds to the risk block type TYPE_2, and store, in the data refresh table TB2, a value 'V1' indicating that a data refresh operation is not required for the second memory block BLK2 with a block number of '#2'. In the present specification, the data refresh operation may include a garbage collection operation.

Figure 19:
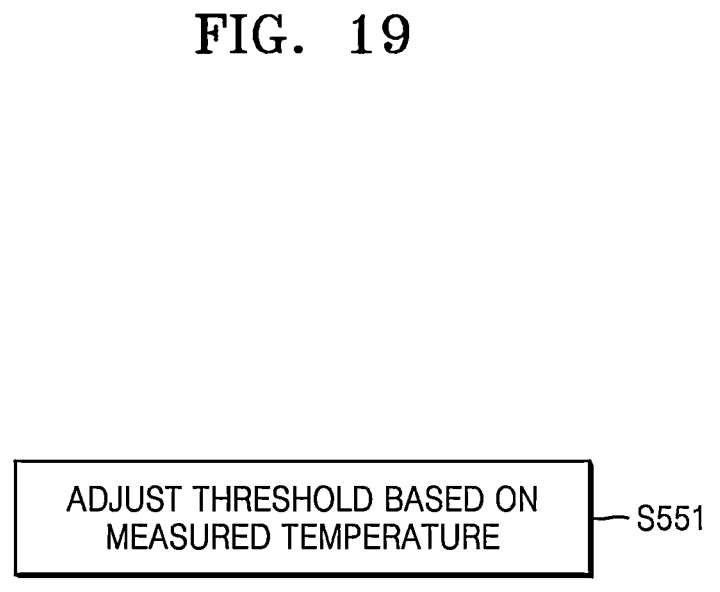

FIG. 19 is a flowchart for describing in detail an operation method of a storage device in operation S550 of FIG. 17.

Referring to FIG. 19, operation S550 of FIG. 17 may include operation S551.

In operation S551, the storage device may adjust the threshold based on the temperature measured in operation S510 (see FIG. 17). As a specific example, the storage device may adjust the threshold to decrease as the measured temperature increases. In some embodiments, the storage device may adjust the threshold to increase as the measured temperature increases. As such, the storage device may adjust an environment in which the time period for programming is limited, according to the measured temperature.

Figure 20:
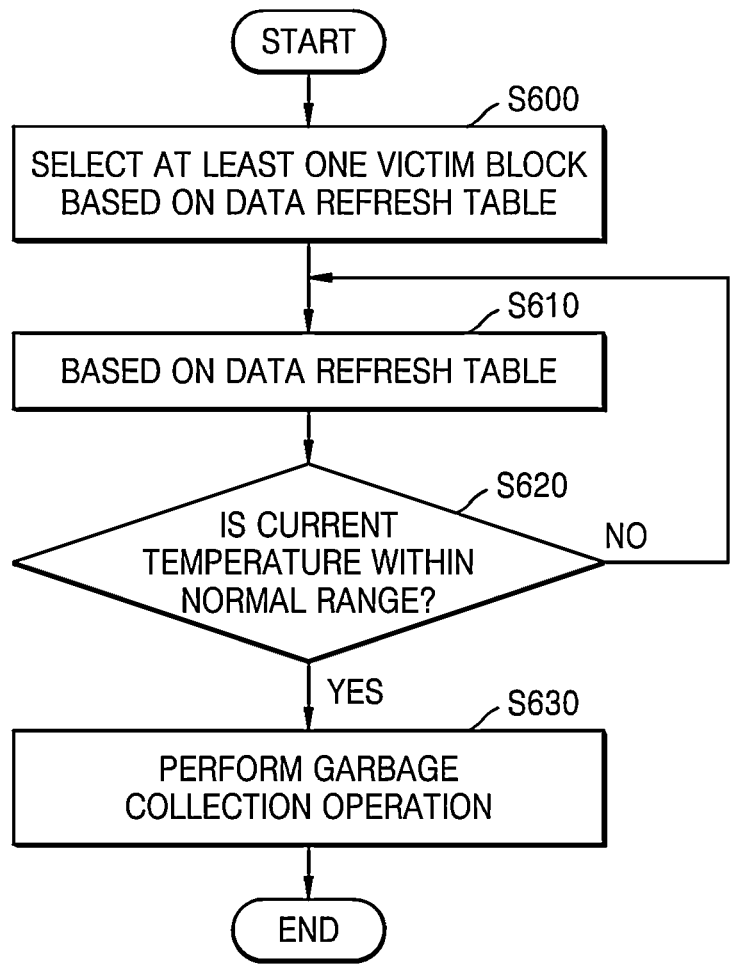
FIG. 20 is a flowchart for describing a data refresh operation of a storage device according to some embodiments.

FIG. 20 is a flowchart for describing a data refresh operation of a storage device according to some embodiments.

Referring to FIG. 20, in operation S600, the storage device may select at least one victim block based on a data refresh table. In detail, the storage device may select at least one normal block on which a normal program operation has been performed in the abnormal range, as at least one victim block, by referring to the data refresh table.

In operation S610, the storage device may measure the current temperature for performing a garbage collection operation as part of the data refresh operation.

In operation S620, the storage device may determine whether the current temperature measured in operation S610 is within the normal range.

When a result of the determination in operation S620 is 'YES', in operation S630, the storage device may perform the garbage collection operation on the at least one victim block selected in operation S600.

When the result of the determination in operation S620 is 'NO', operation S610 may be performed after a preset time period.

Figure 21:
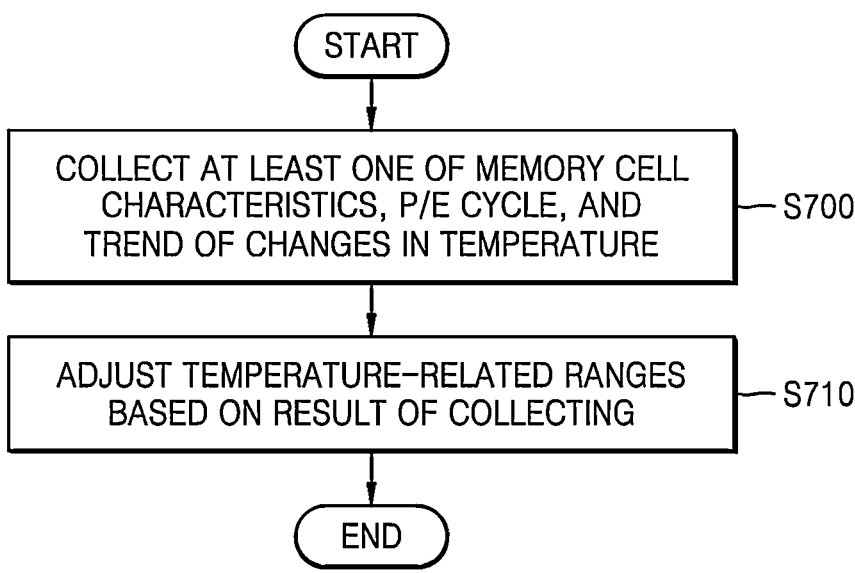
FIG. 21 is a flowchart for describing an operation method of a storage device according to some embodiments.

FIG. 21 is a flowchart for describing an operation method of a storage device according to some embodiments.

Referring to FIG. 21, in operation S700, the storage device may collect at least one of memory cell characteristics of a plurality of memory cells of the memory device, a P/E cycle of the memory device, and/or a trend of changes in temperature.

In operation S710, the storage device may adjust temperature-related ranges based on a result of the collecting in operation S700. In some embodiments, the storage device may adjust the width, position on the temperature axis, and the like of at least one of the normal range and the abnormal range, based on the result of the collecting. Furthermore, the storage device may adjust the width, position on the temperature axis, and the like of at least one of the high temperature range and the low temperature range based on the result of the collecting.

Figure 22:
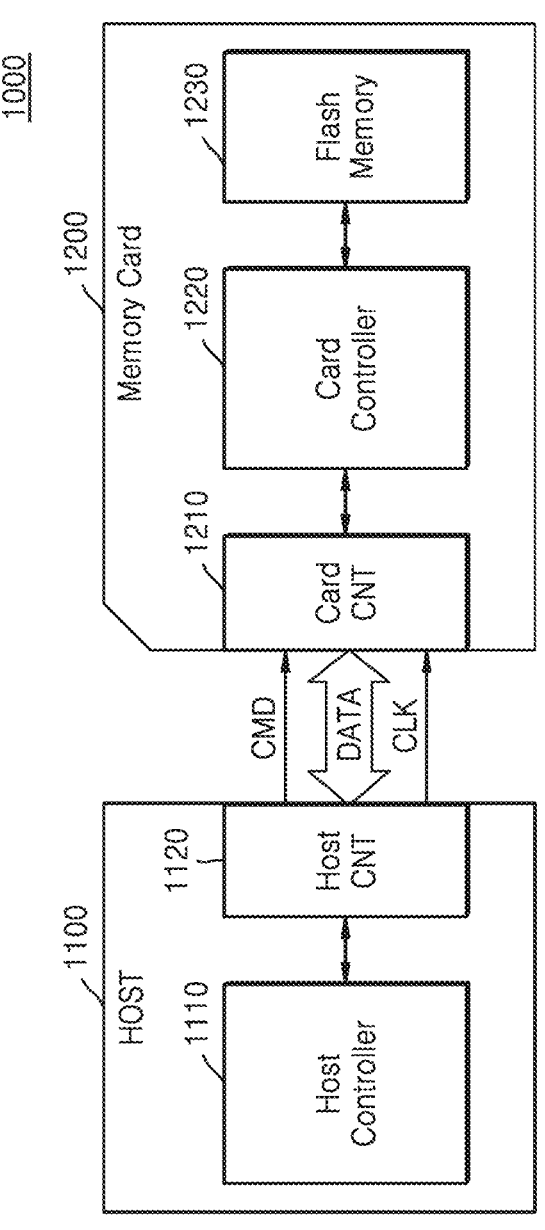
FIG. 22 is a block diagram illustrating a memory card system according to some embodiments.

FIG. 22 is a block diagram illustrating a memory card system 1000 according to some embodiments.

Referring to FIG. 22, the memory card system 1000 may include a host 1100 and a memory card 1200. The memory card 1200 may be a storage device to which the embodiments illustrated in FIG. 1 and other drawings are applied. The host 1100 may include a host controller 1110 and a host connection unit 1120. The memory card 1200 may include a card connection unit 1210, a card controller 1220, and a flash memory 1230.

The host 1100 may write data to the memory card 1200 or read data stored in the memory card 1200. The host controller 1110 may transmit a request (e.g., a write request), a clock signal CLK generated by a clock generator in the host 1100, and data DATA to the memory card 1200 through the host connection unit 1120. In response to a write request received through the card connection unit 1210, the card controller 1220 may store data in the flash memory 1230 in synchronization with a clock signal generated by a clock generator in the card controller 1220. The flash memory 1230 may store the data transmitted from the host 1100.

The card controller 1220 according to some embodiments may measure the internal temperature of the memory card 1200, and based on the measured temperature, activate a risk block from among memory blocks of the flash memory 1230 to control any one of a high-reliability program operation, a high-reliability data migration operation, and a high-reliability garbage collection operation. In addition, the card controller 1220 may manage a block management table for seamlessly controlling the above high-reliability memory operations.

Figure 23:
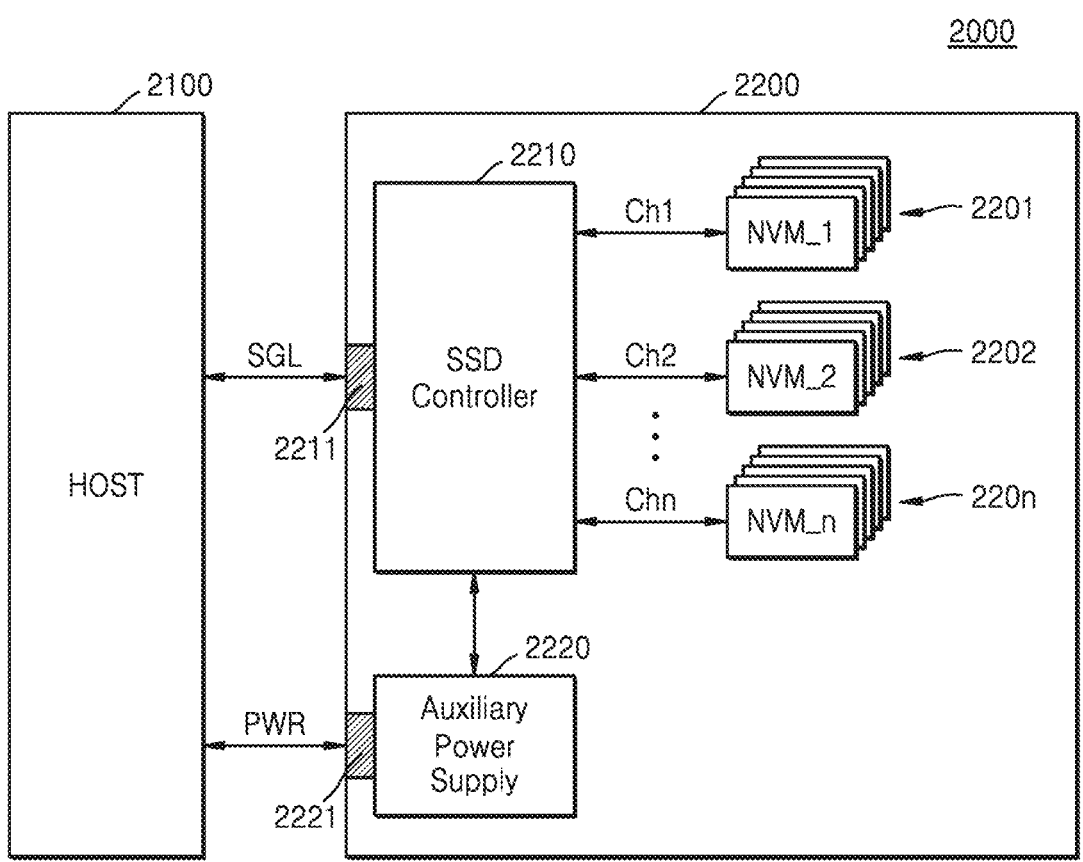
FIG. 23 is a block diagram illustrating a solid-state drive system according to some embodiments.

FIG. 23 is a block diagram illustrating a solid-state drive (SSD) system 2000 according to some embodiments.

Referring to FIG. 23, the SSD system 2000 may include a host 2100 and an SSD 2200. The SSD 2200 may be a storage device to which the embodiments illustrated in FIG. 1 and other drawings are applied.

The SSD 2200 may exchange signals with the host 2100 through a signal connector 2211, and may receive power through a power connector 2221. The SSD 2200 may include a plurality of flash memories 2201, 2202, . . . 220n, an SSD controller 2210, and an auxiliary power supply 2220. The plurality of flash memories 2201, 2202, . . . 220n may be used as a storage medium of the SSD 2200. In addition to the flash memories, the SSD 2200 may also use non-volatile memory devices such as PRAM, MRAM, resistive RAM (ReRAM), or FRAM.

The plurality of flash memories 2201, 2202, . . . 220n may be connected to the SSD controller 2210 through a plurality of channels CH1 to CHn. One or more flash memories may be connected to one channel. Flash memories connected to one channel may be connected to the same data bus. The SSD controller 2210 may exchange signals SGL with the host 2100 through the signal connector 2211. Here, the signals SGL may include a request, an address, data, and the like. In response to a request from the host 2100, the SSD controller 2210 may program data into or read data from the corresponding flash memory.

The auxiliary power supply 2220 may be connected to the host 2100 through the power connector 2221. The auxiliary power supply 2220 may receive power PWR from the host 2100 and charge. Meanwhile, the auxiliary power supply 2220 may be inside or outside the SSD 2200. For example, the auxiliary power supply 2220 may be located on a main board, and may provide auxiliary power to the SSD 2200.

In some embodiments, the SSD controller 2210 may measure the internal temperature of the SSD 2200, and based on the measured temperature, activate a risk block of any one of the plurality of flash memories 2201, 2202, . . . 220*n* to control any one of a high-reliability program operation, a high-reliability data migration operation, and a high-reliability garbage collection operation. In addition, the SSD controller 2210 may manage a block management table for seamlessly controlling the above high-reliability memory operations.

In some embodiments, the SSD controller 2210 may classify the flash memories by channel, and activate or deactivate a function of each of the classified flash memories according to the inventive concept.

Embodiments have been described herein and illustrated in the drawings. Although the embodiments have been described herein by using specific terms, they are used only for the purpose of explaining the inventive concept and not used to limit the meaning or scope of the claims. Therefore, those of skill in the art will understand that various modifications and other equivalent embodiments may be derived from the embodiments described herein. Therefore, the true technical protection scope of the inventive concept should be determined by the appended claims.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof. It will be understood that, although the terms first, second, etc. may be used herein to describe various elements, these elements should not be limited by these terms. Rather, these terms are only used to distinguish one element from another. For example, a first element could be termed a second element, and, similarly, a second element could be termed a first element, without departing from the scope of the present disclosure.

While the inventive concept has been particularly shown and described with reference to embodiments thereof, it will be understood that various changes in form and details may be made therein without departing from the spirit and scope of the following claims.

What is claimed is:

1. A storage device comprising:
a memory device comprising a plurality of memory blocks each comprising a plurality of memory cells;
a controller configured to control a program operation of the memory device in response to a write request received from a host; and
a temperature sensor configured to measure an internal temperature,
wherein the controller is further configured to, based on a first temperature measured by the temperature sensor, activate one of the plurality of memory blocks as a risk block and then control a high-reliability program operation using the risk block, or activate the one of the plurality of memory blocks as a first normal block and then control a normal program operation using the first normal block,
wherein the controller is further configured to activate one of the plurality of memory blocks as the risk block by selecting a memory block that is a target of the high-reliability program operation from among the plurality of memory blocks, and to store, in a block management table, information indicating that the high-reliability program operation has been performed on the memory block that was selected.

2. The storage device of claim 1, wherein the controller is further configured to perform operations comprising:
when the first temperature is within a high temperature range, controlling a first high-reliability program operation based on a first deterioration characteristic of the plurality of memory cells in the high temperature range,
when the first temperature is within a low temperature range, controlling a second high-reliability program operation based on a second deterioration characteristic of the plurality of memory cells in the low temperature range, and
when the first temperature is within a normal range, controlling the normal program operation.

3. The storage device of claim 2, wherein, when programming a same amount of data, a programming time period for performing the second high-reliability program operation is greater than a programming time period for performing the normal program operation, and a programming time period for performing the first high-reliability program operation is greater than the programming time period for performing the second high-reliability program operation.

4. The storage device of claim 2, wherein the first high-reliability program operation is based on a first program scheme for causing first threshold voltage distributions of memory cells into which data is programmed to be sharper than second threshold voltage distributions formed by the normal program operation, and
wherein the second high-reliability program operation is based on a second program scheme for causing a first gap between a threshold voltage distribution in an erased state and a threshold voltage distribution in a first program state, among the first threshold voltage distributions, to be greater than a second gap between a threshold voltage distribution in the erased state and a threshold voltage distribution in the first program state, among the second threshold voltage distributions.

5. The storage device of claim 2, wherein the high temperature range comprises a plurality of first sub-ranges, and
wherein the controller is further configured to control the first high-reliability program operation based on a setting corresponding to a first sub-range to which the first temperature belongs, among the plurality of first sub-ranges.

6. The storage device of claim 5, wherein the plurality of first sub-ranges respectively correspond to settings that differ from each other in at least one of a number of program loops or a voltage offset in an incremental step pulse program (ISPP) scheme.

7. The storage device of claim 5, wherein the low temperature range comprises a plurality of second sub-ranges that is different from the plurality of first sub-ranges, and
wherein the controller is further configured to control the second high-reliability program operation based on a setting corresponding to a second sub-range to which the first temperature belongs, among the plurality of second sub-ranges.

8. The storage device of claim 7, wherein the plurality of second sub-ranges respectively correspond to settings that differ from each other in a voltage level of a verify voltage for distinguishing between a threshold voltage distribution in an erased state, and a threshold voltage distribution in a first program state.

9. The storage device of claim 1, wherein the controller is further configured to identify the risk block based on a block management table indicating whether each of the plurality of memory blocks is of a risk block type or a normal block type, and when a number of error bits of the identified risk block is greater than a threshold number, control a garbage collection operation on the risk block.

10. The storage device of claim 9, wherein the risk block comprises a first risk block, and wherein the controller is further configured to, based on at least one of a second temperature measured by the temperature sensor and whether the garbage collection operation is urgently needed, activate one of the plurality of memory blocks as a second risk block and then control a high-reliability garbage collection operation using the second risk block, or activate one of the plurality of memory blocks as a second normal block and then control a normal garbage collection operation using the second normal block.

11. A storage device comprising:

a memory device comprising a first memory block operated as a single-level cell, and second memory blocks operated as a multi-level cell;

a controller configured to control a program operation of the memory device in response to a write request received from a host; and a temperature sensor configured to measure an internal temperature, wherein the program operation of the memory device in response to a write request comprises programming data corresponding to the write request into the first memory block, and based on a first temperature measured by the temperature sensor within a preset time period, activating one of the second memory blocks as a risk block and then controlling a high-reliability data migration operation on the data by using the risk block, or activating one of the second memory blocks as a normal block and then controlling a normal data migration operation on the data by using the normal block, wherein the controller is further configured to activate one of the second memory blocks as the risk block by selecting a second memory block that is a target of the high-reliability data migration operation from among the second memory blocks, and to store, in a block management table, information indicating that the high-reliability data migration operation has been performed on the second memory block that was selected.

12. The storage device of claim 11, wherein the controller is further configured to perform operations comprising:

when the internal temperature is within a high temperature range, controlling a first high-reliability program operation based on a first deterioration characteristic of a plurality of memory cells included in the second memory blocks in the high temperature range that are included in the high-reliability data migration operation, when the internal temperature is within a low temperature range, controlling a second high-reliability program operation based on a second deterioration characteristic of the plurality of memory cells in the low temperature range that are included in the high-reliability data migration operation, and when the internal temperature is within a normal range, controlling a normal program operation that is included in the normal data migration operation.

13. The storage device of claim 11, wherein the controller is further configured to, when the data is unable to be stored in the first memory block, based on a second temperature measured by the temperature sensor, activate one of the second memory blocks as a risk block and then control a high-reliability program operation of storing the data in the risk block, or activate one of the second memory blocks as a normal block and then control a normal program operation of storing the data in the normal block.

14. A storage device comprising:

a memory device comprising a plurality of memory blocks each comprising a plurality of memory cells;

a controller configured to control a program operation of the memory device in response to at least one write request received from a host; and a temperature sensor configured to measure an internal temperature, wherein the controller is further configured to, based on at least one of a first temperature measured by the temperature sensor or whether an environment is limited in a time period for programming, activate one of the plurality of memory blocks as a risk block and then control a high-reliability program operation using the risk block, or activate one of the plurality of memory blocks as a normal block and then control a normal program operation using the normal block, wherein cell types of the plurality of memory blocks are the same, wherein a program scheme for the high-reliability program operation is different from a program scheme for the normal program operation, and wherein the program scheme is associated with a number of program loops and levels of program/verify voltages.

15. The storage device of claim 14, wherein the controller is further configured to perform operations comprising:

when the first temperature is within a normal range, controlling the normal program operation, and when the first temperature is within an abnormal range, determining whether the environment is limited in the time period for programming, and selectively controlling one of the high-reliability program operation or the normal program operation based on a result of the determining.

16. The storage device of claim 15, wherein the controller is further configured to perform operations comprising: when an amount of data requested by the host to be input/output per unit time is greater than or equal to a threshold, determining that the environment is limited in the time period for programming; and controlling the normal program operation when the environment is limited in the time period for programming, and controlling the high-reliability program operation when the environment is not limited in the time period for programming.

17. The storage device of claim 14, wherein, when programming a same amount of data, a programming time period for performing the high-reliability program operation is greater than a programming time period for performing the normal program operation.

18. The storage device of claim 14, wherein the controller is further configured to, when controlling the normal program operation while the first temperature is within an abnormal range and the environment is limited in the time period for programming, register the normal block in a data refresh table to indicate that a garbage collection operation on the normal block is needed.

19. The storage device of claim 18, wherein the controller is further configured to select the normal block as a victim block based on the data refresh table, and when a second temperature measured by the temperature sensor is within a normal range, control a garbage collection operation on the victim block.

* * * * *